(12) United States Patent
Han et al.

(10) Patent No.: US 9,851,589 B2
(45) Date of Patent: Dec. 26, 2017

(54) META-STRUCTURE AND TUNABLE OPTICAL DEVICE INCLUDING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Seunghoon Han, Seoul (KR); Georgia Theano Papadakis, Pasadena, CA (US); Harry Atwater, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/233,036

(22) Filed: Aug. 10, 2016

(65) Prior Publication Data

US 2017/0045759 A1 Feb. 16, 2017

Related U.S. Application Data

(60) Provisional application No. 62/203,044, filed on Aug. 10, 2015.

(30) Foreign Application Priority Data

Jun. 1, 2016 (KR) .................. 10-2016-0068110

(51) Int. Cl.
*G02F 1/01* (2006.01)
*G02F 1/00* (2006.01)
(Continued)

(52) U.S. Cl.
CPC ........... *G02F 1/0121* (2013.01); *G02B 1/002* (2013.01); *G02F 1/0018* (2013.01);
(Continued)

(58) Field of Classification Search
CPC .... G02F 1/0121; G02F 1/0018; G02F 1/0105; G02F 1/0136; G02F 2203/10;
(Continued)

(56) References Cited

U.S. PATENT DOCUMENTS

| 5,773,930 | A | 6/1998 | Ahn |
| 2005/0018301 | A1 | 1/2005 | Uehara |

(Continued)

FOREIGN PATENT DOCUMENTS

KR 10-0195102 B1 6/1999

OTHER PUBLICATIONS

Georgia T. Papadakis, "Field-effect induced tunability in hyperbolic metamaterials", Physical Review B 92, 184101 (2015), American Physical Society.*

(Continued)

*Primary Examiner* — Harry W Byrne
*Assistant Examiner* — Ajay Ojha
(74) *Attorney, Agent, or Firm* — Sughrue Mion, PLLC

(57) ABSTRACT

A meta-structure and a tunable optical device including the same are provided. The meta-structure includes a plurality of metal layers spaced apart from one another, an active layer spaced apart from the plurality of metal layers and having a carrier concentration that is tuned according to an electric signal applied to the active layer and the plurality of metal layers, and a plurality of dielectric layers spaced apart from one another and each having one surface contacting a metal layer among the plurality of metal layers and another surface contacting the active layer.

20 Claims, 18 Drawing Sheets

(51) Int. Cl.
G02B 1/00 (2006.01)
G11C 13/04 (2006.01)
H01L 29/786 (2006.01)

(52) U.S. Cl.
CPC .......... *G02F 1/0105* (2013.01); *G02F 1/0136* (2013.01); *G11C 13/047* (2013.01); *G11C 13/048* (2013.01); *H01L 29/786* (2013.01); *G02F 2202/30* (2013.01); *G02F 2203/10* (2013.01)

(58) Field of Classification Search
CPC . G02F 2202/30; G11C 13/048; G11C 13/047; G02B 1/002
See application file for complete search history.

(56) References Cited

U.S. PATENT DOCUMENTS

2012/0097949 A1* 4/2012 Tessler ............... B82Y 10/00
257/57
2016/0223723 A1 8/2016 Han et al.

OTHER PUBLICATIONS

Georgia T. Papadakis, et al., "Extreme, broadband tunable values of birefringence and dichroism and tunable optical band-gaps", California Institute of Technology, Samsung Advanced Institute of Technology, 2015, pp. 1-22.
Mohamed A. K. Othman, et al., "Graphene-based tunable hyperbolic metamaterials and enhanced near-field absorption", Optical Society of America, vol. 21, No. 6, Optics Express 7614, Mar. 25, 2013, total 19 pages.
Jingjing Liu, et al., "Optical absorption of hyperbolic metamaterial with stochastic surfaces", Optical Society of America, vol. 22, No. 8, Optics Express 8893, Apr. 21, 2014, total 9 pages.
Zhou et al., "Experiment and Theory of the Broadband Absorption by a Tapered Hyperbolic Metamaterial Array", ACS Photonics, 1, 2014, 618-624.
Esslinger et al., "Tetradymites as Natural Hyperbolic Materials for the Near-Infrared to Visible", ACS Photonics, 1, 2014, 1285-1289.
Wood et al., "Optical properties of cubic hafnia stabilized with yttria", Applied Optics, Feb. 1, 1990, 604-607, vol. 29, No. 4.
Mergel et al., "Dielectric modelling of optical spectra of thin In2O3: Sn films", Journal of Physics D: Applied Physics, 2002, 9 pages, vol. 35.
Jacob et al., "Engineering photonic density of states using metamaterials", Applied Physics B, 2010, 215-216.
Tanner et al., "Electrical performance of Al2O3 gate dielectric films deposited by atomic layer deposition on 4H-SiC", Applied Physics Letters, 2007, total 4 pages.
Sire et al., "Statistics of electrical breakdown field in HfO2 and SiO2 films from millimeter to nanometer length scales", Applied Physics Letters, 2007, total 4 pages.
Coenen et al., "Angle-resolved cathodoluminescence spectroscopy", Applied Physics Letters, 2011, total 4 pages.
Yi et al., "Voltage tuning of plasmonic absorbers by indium tin oxide", Applied Physics Letters, 2013, total 5 pages.
Liu et al., "Quantification and impact of nonparabolicity of the conduction band of indium tin oxide on its plasmonic properties", Applied Physics Letter, 2014, total 6 pages.
Rittersma et al., "HfSiO4 Dielectric Layers Deposited by ALD Using HfC14 and NH2 (CH2)3Si(OC2H5)3 Precursors", Journal of the Electrochemical Society, 2004, C716-C722.
Weile, Daniel S., "Reviews and Abstracts", IEEE Antennas and Propagation Magazine, Aug. 2007, 137-139, vol. 29, No. 4.
Lu et al., "Ultracompact Electroabsoprtion Modulatros Based on Tunable Epsilon-Near-Zero-Slot Waveguides", IEEE Photonics Journal, Jun. 2012, total 7 pages, vol. 4, No. 3.
Turpin et al., "Reconfigurable and Tunable Metamaterials: a Review of the Theory and Applications", International Journal of Antennas and Propagation, 2014, 1-18, vol. 2014.
Feigenbaum et al., "Unity-Order Index Change in Transparent Conducting Oxides at Visible Frequencies", Nano Letters, 2010, 2111-2116.
Lee et al., "Nanoscale Conducting Oxide PlasMOStor", Nano Letters, 2014, 6463-6468.
Huang et al., "Three-dimensional optical holography using a plasmonic metasurface", Nature Communications, Nov. 15, 2013, 1-8.
Mahmoud et al., "Wave-matter interactions in epsilon-and-mu-near-zero structures", Nature Communications, Dec. 5, 2014, 1-7.
Hoffman et al., "Negative refraction in semiconductor metamaterials", Nature Materials, Dec. 2007, 946-950, vol. 6.
Ou et al., "An electromechanically reconfigurable plasmonic metamaterial operating in the near-infrared", Nature Nanotechnology, Apr. 2013, total 6 pages, vol. 8.
Lu et al., "Enhancing spontaneous emission rates of molecules using nanopatterned multilayer hyperbolic metamaterials", Nature Nanotechnology, Jan. 2014, 48-53, vol. 9.
Maas et al., "Experimental realization of an epsilon-near-zero metamaterial at visible wavelenghts", Nature Photonics, Nov. 2013, 907-912, vol. 7.
Poddubny et al., "Hyperbolic metamaterials", Nature Photonics, Dec. 2013, total 11 pages, vol. 7.
Choi et al., "A terahertz metamaterial with unnaturally high refractive index", Nature, Feb. 17, 2011, 369-373, vol. 470.
Dicken et al., "Frequency tunable near-infrared metamaterials based on VO2 phase transition", Optics Express, Sep. 28, 2009, 18330-18339, vol. 17, No. 20.
Gong et al., "Highly flexible all-optical metamaterial absoprtion switching assisted by Kerr-nonlinear effect", Optics Express, May 23, 2011, 10193-10198 , vol. 19, No. 11.
Dolling et al., "Low-loss negative-index metamaterial at telecommunication wavelengths", Optics Express, Jun. 15, 2006, 1800-1802, vol. 31, No. 12.
Michelotti et al., "Thickness dependence of surface plasmon polariton dispersion in transparent conducting oxide films at 1.55 µm", Optics Letters, Mar. 15, 2009, 839-841, vol. 34, No. 6.
Zhu et al., "Phase modulation in horizontal metal-insulator-silicon-insulator-metal plasmonic waveguides", Optics Express, Apr. 8, 2013, 8320-8330, vol. 21, No. 7.
Vasudev et al., "Electro-optical modulation of a silicon waveguide with an 'epsilon-near-zero' material", Optics Express, Nov. 4, 2013, 26387-26397, vol. 21, No. 22.
Babicheva et al., "Towards CMOS-compatible nanophotonics: Ultra-compact modulators using alternative plasmonic materials", Optics Express, Nov. 4, 2013, 27326-27337, vol. 21, No. 22.
Kuttge et al., "Dispersion of metal-insulator-metal plasmon polaritons probed by cathodoluminescence imaging spectroscopy", Physical Review B, 2009, total 4 pages, vol. 80.
Shchelokova et al., "Magnetic topological transition in transmission line metamaterials", Physical Review B, 2014, total 5 pages, vol. 90.
Papadakis et al., "Retrieval of material parameters for uniaxial metamaterials", Physical Review B, 2015, total 12 pages, vol. 91.
Pendry, J.B., "Negative Refraction Makes a Perfect Lens", Physical Review Letters, Oct. 30, 2000, 3966-3969, vol. 75, No. 18.
Kim et al., "Optical Huygens' Metasurfaces with Independent Control of the Magnitude and Phase of the Local Reflection Coefficients", Physical Review X, 2014, total 11 pages, vol. 4.
Kalavrouziotis et al., "0.48Tb/s (12x40Gb/s) WDM transmission and high-quality thermo-optic switching in dielectric loaded plasmonics", Optics Express, Mar. 26, 2012, 7655-7662, vol. 20, No. 7.
Boltasseva et al., "Low-Loss Plasmonic Metamaterials", Science, Jan. 21, 2011, total 3 pages, vol. 331.
Nader Engheta, "Pursuing Near-Zero Response", Science, Apr. 19, 2013, total 3 pages, vol. 340.
J. Robertson, "High Dielectric constant oxides", the European Physical Journal Applied Physics, 2004, 265-291, vol. 28.

(56) References Cited

OTHER PUBLICATIONS

Groner et al., "Electrical characterization of thin Al2O3 films grown by atomic layer deposition on silicon and various metal substrates", Thin Solid Films, 2002, 186-197, vol. 413.
Qiao et al., "Dielectric modeling of transmittance spectra of thin ZnO: Al films", Thin Solid Films, 2006, 520-525, vol. 496.

* cited by examiner

λ = 400nm

λ = 500nm

META-STRUCTURE AND TUNABLE OPTICAL DEVICE INCLUDING THE SAME

CROSS-REFERENCE TO RELATED APPLICATIONS

This application claims the benefit of U.S. Provisional Application No. 62/203,044, filed on Aug. 10, 2015 in the U.S. Patent and Trademark Office and priority from Korean Patent Application No. 10-2016-0068110, filed on Jun. 1, 2016 in the Korean Intellectual Property Office, the disclosures of which are incorporated herein in their entireties by reference.

STATEMENT OF GOVERNMENT LICENSE RIGHTS

This invention was made with government support under Grant No.FA9550-12-1-0488 awarded by the Air Force and under Grant No.DE-FG02-07ER46405 awarded by the Department of Energy. The government has certain rights in the invention.

BACKGROUND

1. Field

The present disclosure relates to meta-structures and tunable optical devices including the same.

2. Description of the Related Art

A metamaterial is engineered to have an optical property that is not found in nature. Metamaterials have an artificial structure in which smaller scales than the wavelengths of incident light are applied to thicknesses, patterns or periods, etc. It is known that metamaterials can be used to create or control new phenomena, such as subwavelength focusing, negative refraction, extraordinary transmission, and invisibility cloaking, with respect to electromagnetic waves, sound waves, or ultrasonic waves. Examples of metamaterials include photonic crystals, plasmonic structures, and the like.

Metamaterials can have various optical characteristics. Also, it is expected that metamaterials can be applied to a subminiature structure having a high response speed, and attempts to apply the metamaterials to optical devices that change transmission or reflection, polarization, a phase, intensity, a path, and the like of incident light are continuously being made.

SUMMARY

One or more exemplary embodiments provide meta-structures that may tune optical parameters in a wide range.

Further, one or more exemplary embodiments provide tunable optical devices that utilize meta-structures.

According to an aspect of an exemplary embodiment, there is provided a meta-structure including: a plurality of metal layers spaced apart from one another; an active layer spaced apart from the plurality of metal layers and having a carrier concentration that is tuned according to an electric signal applied to the active layer and the plurality of metal layers; and a plurality of dielectric layers spaced apart from one another and each having one surface contacting a metal layer among the plurality of metal layers and another surface contacting the active layer.

The meta-structure may further include a voltage-applying portion configured to apply a voltage between the active layer and the plurality of dielectric layers to generate the electrical signal.

The voltage-applying portion applies a same voltage between the active layer and each of the plurality of metal layers.

When a voltage is applied between the active layer and the plurality of metal layers, carrier accumulation layers having a tunable charge density may be formed on ends of the active layer that contact the plurality of dielectric layers among regions of the active layer.

The active layer may include a transparent conductive oxide, a nitride, or a doped semiconductor material.

The dielectric layer may include any one among $SiO_2$, $Al_2O_3$, $HfO_2$, $HfSiO_4$, a transition metal oxide, and electrochromic polymer.

A dielectric breakdown electric field $E_{br}$ and a direct current (DC) dielectric constant $k_{diel}$ of one of the dielectric layers may satisfy the following equation:

$$k_{diel} E_{br} \geq \frac{|e|Nd}{\varepsilon_0},$$

where N is a carrier concentration of the carrier accumulation layers, e is a quantity of electric charge of electrons, $\varepsilon_0$ is a permittivity of a vacuum, and d is a Debye length.

The metal layer may include one among Cu, Al, Ni, Fe, Co, Zn, Ti, Ru, Rh, Pd, Pt, Ag, Os, Ir, Au, and TiN.

According to an aspect of another exemplary embodiment, there is provided a tunable optical device including: a meta-structure including: a plurality of metal layers spaced apart from one another; an active layer spaced apart from the plurality of metal layers and having a carrier concentration that is tuned according to an electric signal applied to the active layer and the plurality of metal layers; and a plurality of dielectric layers spaced apart from one another and each having one surface contacting a metal layer among the plurality of metal layers and another surface contacting the active layer, a voltage-applying portion configured to apply a voltage between the active layer and the plurality of metal layers to generate the electric signal; and a controller configured to control the voltage to be applied between the active layer and the plurality of metal layers by the voltage-applying portion according to an optical property to be controlled in the meta-structure.

The controller may be configured to control the voltage so that birefringence of the meta-structure is tuned.

The controller may be configured to control the voltage so that dichroism of the meta-structure is tuned.

The controller may be configured to control the voltage so that an optical band gap of the meta-structure is tuned.

The tunable optical device may further include: a plurality of the meta-structures arranged two-dimensionally; and a circuit board including a circuit element configured to apply a voltage to each of the plurality of meta-structures.

The extraordinary axis of each of the meta-structures is defined as a direction along which the plurality of metal layers, the active layer, and the plurality of dielectric layers are spaced apart, and the extraordinary axis of each of the meta-structures may be in parallel to a plane defined by the two-dimensional arrangement.

The extraordinary axis of each of the meta-structures is defined as a direction along which the plurality of metal layers, the active layer, and the plurality of dielectric layers are spaced apart, and the extraordinary axis of each of the meta-structures may be perpendicular to a plane defined by the two-dimensional arrangement.

According to an aspect of another exemplary embodiment, there is provided a display apparatus including: a first substrate including a first polarization plate; a second substrate including a second polarization plate; an optical modulator provided between the first substrate and the second substrate and including a plurality of meta-structures, each of the meta-structures including: a plurality of metal layers spaced apart from one another; an active layer spaced apart from the plurality of metal layers and having a carrier concentration that is tuned according to an electric signal applied to the active layer and the plurality of metal layers; and a plurality of dielectric layers spaced apart from one another and each having one surface contacting a metal layer among the plurality of metal layers and another surface contacting the active layer; and a circuit board including a circuit element configured to apply a voltage to each of the plurality of meta-structures to generate the electrical signal.

The display apparatus may further include a backlight unit configured to provide light to be modulated by the optical modulator.

According to an aspect of another exemplary embodiment, there is provided an optical memory device including: a meta-structure including: a plurality of metal layers spaced apart from one another; an active layer spaced apart from the plurality of metal layers and having a carrier concentration that is tuned according to an electric signal applied to the active layer and the plurality of metal layers; and a plurality of dielectric layers spaced apart from one another and each having one surface contacting a metal layer among the plurality of metal layers and another surface contacting the active layer; a first quantum emitter and a second quantum emitter, the first and second quantum emitters provided adjacent to the meta-structure and configured to exchange optical energy with each other; and a controller configured to apply a voltage for controlling an optical band gap of the meta-structure to the meta-structure.

The first and second quantum emitters may be provided on the meta-structure or embedded in the meta-structure.

The controller may be configured to apply a first voltage to the meta-structure when the second quantum emitter is excited by optical energy emitted according to a change of a state of the first quantum emitter and configured to apply a second voltage different from the first voltage to the meta-structure in a state in which the second quantum emitter is preserved.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
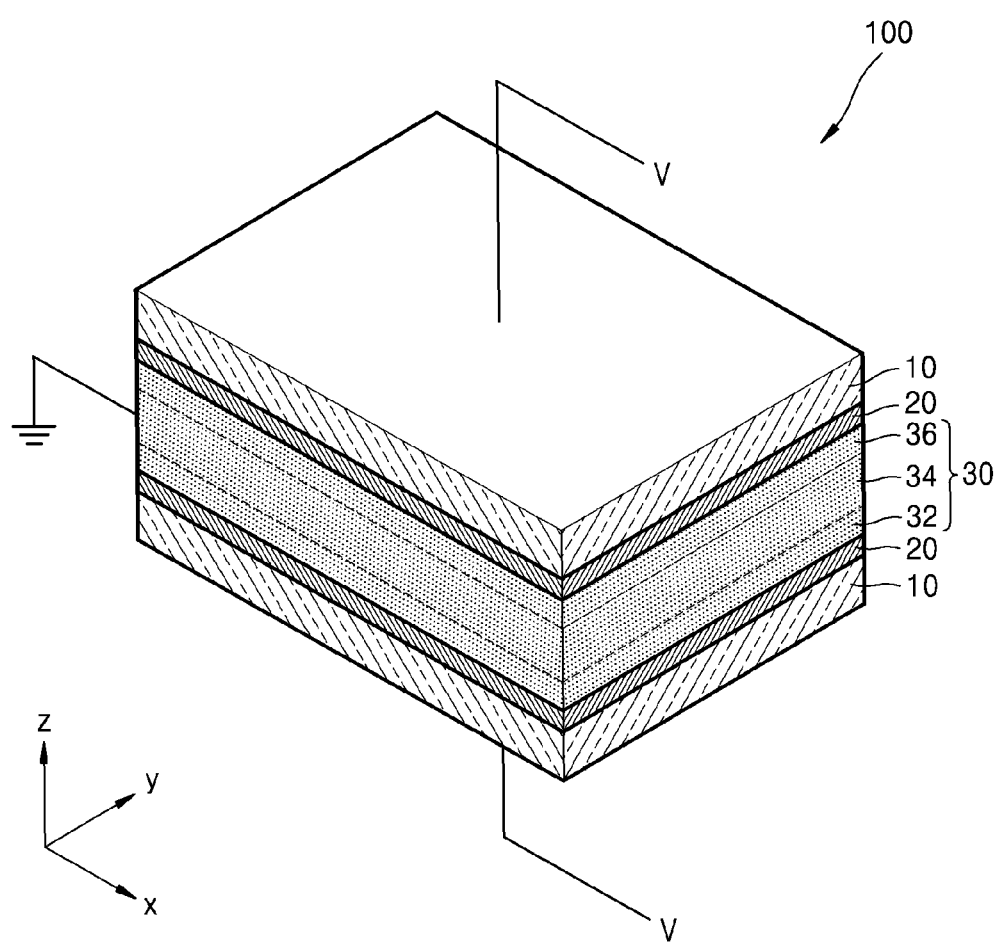
FIG. 1 is a perspective view illustrating a schematic structure of a meta-structure according to an exemplary embodiment.

Hereinafter, exemplary embodiments will be described with reference to the accompanying drawings in detail. In the drawings, like reference numerals refer to like elements, and sizes of elements in the drawings may be exaggerated for clarity and convenience of explanation. Exemplary embodiments that will be described later are just exemplary and may be modified in various ways.

Hereinafter, it will be understood that when an element or layer is referred to as being "formed on", another element or layer, it can be in contact with and directly formed on or in non-contact with and indirectly formed on the other element or layer.

As used herein, the singular forms "a," "an," and "the," are intended to include the plural forms as well, unless the context clearly indicates otherwise. It will be further understood that the terms "comprises," "comprising," "includes," and/or "including," when used herein, specify the presence of other elements but do not preclude the presence or addition of other elements unless specifically oppositely stated.

In addition, the terms, such as " . . . portion (unit)", "module", and the like, refer to a unit for performing at least one function or operation. The unit may be implemented with hardware or software or a combination of hardware and software. As used herein, the term "and/or" includes any and all combinations of one or more of the associated listed items.

FIG. 1 is a perspective view illustrating a schematic structure of a meta-structure 100 according to an exemplary embodiment.

The meta-structure 100 includes a plurality of metal layers 10 spaced apart from one another, an active layer 30 spaced apart from the plurality of metal layers 10 and having a carrier concentration that is tunable according to electrical signals, and a plurality of dielectric layers 20 spaced apart from one another and each having one surface contacting one among the plurality of metal layers 10 and the other surface contacting the active layer 30.

The meta-structure 100 may have a structure in which the metal layer 10, the dielectric layer 20, the active layer 30, the dielectric layer 20, and the metal layer 10 are sequentially stacked in a Z-direction, as illustrated.

The meta-structure 100 may further include a voltage-applying portion for applying a voltage between the active layer 30 and the plurality of metal layers 10. As illustrated, an equal voltage may be applied between the active layer 30 and the plurality of metal layers 10. However, exemplary embodiments are not limited thereto.

The active layer 30 has a property in which a carrier concentration is tuned according to electrical signals. When a voltage is applied between the active layer 30 and the plurality of metal layers 10, carrier accumulation layers 32 and 36 having a tunable charge density are formed on both ends that contact the plurality of dielectric layers 20 among regions of the active layer 30. That is, the regions of the active layer 30 may be divided into the carrier accumulation layers 32 and 36 and a background layer 34 depending on a property of a carrier distribution change according to electrical signals. The background layer 34 has no carrier concentration change according to a change of electrical signals, whereas the carrier accumulation layers 32 and 36 have a relatively large concentration change depending on accumulation and depletion of carriers according to the change of electrical signals. When no electrical signals are applied to the active layer 30, carrier concentrations of the background layer 34 and the carrier accumulation layers 32 and 36 are equal to initial carrier concentrations thereof. When electrical signals are applied to the active layer 30, there is no carrier concentration change of the background layer 34, whereas the carrier concentrations of the carrier accumulation layers 32 and 36 change sensitively according to the electrical signals.

The active layer 30 has a property in which a carrier concentration is tuned according to the electrical signals. Various materials that have the property may be employed in the active layer 30. For example, the active layer 30 may include a transparent conductive oxide (TCO), such as indium tin oxide (ITO), indium zinc oxide (IZO), aluminum zinc oxide (AZO), or gallium zinc oxide (GZO). Any material that is sensitive to a field effect induced due to carrier concentration change, in addition to TCO, may be employed in the active layer 30. A transition metal nitride, such as a titanium nitride (TiN), a zirconium nitride (ZrN), a hafnium nitride (HfN), or a tantalum nitride (TaN), may be employed, and other various materials may be employed. Also, an electro-optic material having tunable effective permittivity when electrical signals are applied to the active layer 30, e.g., $LiNbO_3$, $LiTaO_3$, potassium tantalate niobate (KTN), or lead zirconate titanate (PZT), may be used, and various polymer materials having an electro-optic property may be used. A semiconductor material may be employed in the active layer 30, and a doped semiconductor material may also be employed in the active layer 30.

A metal material having high conductivity, in which surface plasmon excitation may occur, may be employed in the metal layer 10. For example, at least one selected from the group consisting of gold (Au), copper (Cu), aluminum (Al), platinum (Pt), silver (Ag), nickel (Ni), iron (Fe), cobalt (Co), zinc (Zn), titanium (Ti), ruthenium (Ru), rhodium (Rh), palladium (Pd), osmium (Os), and iridium (Ir) may be employed in the metal layer 10, and the metal layer 10 may include an alloy including one thereof, for example, TiN. Also, a two-dimensional material having good conductivity, such as graphene, or a conductive oxide may be employed in the metal layer 10.

Various dielectric materials may be used for the dielectric layer 20. For example, any one among $SiO_2$, $Al_2O_3$, $HfO_2$, $HfSiO_4$, a transition metal oxide, and electrochromic polymer may be used for the dielectric layer 20. A material that endures breakdown due to an electric field formed by an externally applied bias voltage V has to be employed in the dielectric layer 20. The active layer 30 including the carrier accumulation layers 32 and 36 and the background layer 34 may approximately be a uniform layer having a thickness corresponding to a Debye length having a higher carrier concentration than the carrier concentration of the background layer 34. The following Equation (1) may be obtained through an approximate calculation of metal/dielectric/TCO:

$$\frac{V}{t} = \frac{|e|Nd}{k_{diel}\varepsilon_0} \leq E_{br}, \qquad \text{Equation (1)}$$

where t is a thickness of the dielectric layer 20, V is an applied voltage, $E_{br}$ is a dielectric breakdown electric field of the dielectric layer 20, N is carrier concentrations of the carrier accumulation layers 32 and 36, e is a quantity of electric charge of electrons, $\varepsilon_0$ is a permittivity of a vacuum, $k_{diel}$ is a direct current (DC) dielectric constant of the dielectric layer 20, and d is a Debye length.

That is, the dielectric breakdown electric field and the DC dielectric constant of the dielectric layer 20 may be formed of a material that satisfies the following Equation (2):

$$k_{diel}E_{br} \geq \frac{|e|Nd}{\varepsilon_0} \qquad \text{Equation (2)}$$

The plurality of metal layers 10 and the plurality of dielectric layers 20 that are disposed in different positions are not limited to being formed of the same materials and each may be formed of any one of the above-described materials.

Each of the layers that constitute the meta-structure 100 has a sub-wavelength thickness. According to an exemplary embodiment, the term "sub-wavelength" refers to a dimension smaller than operating wavelengths of the meta-structure 100. In other words, the meta-structure 100 may represent various optical performances that will be described later, with respect to light having a larger wavelength than the thickness of each layer.

Hereinafter, various optical performances of the meta-structure 100 will be described with reference to approximate equations and computer simulation results. The computer simulation results that will be suggested below are based on the assumption that materials for the metal layer 10, the dielectric layer 20, and the active layer 30 are Ag, HfO$_2$, and ITO, respectively.

It is known that a hyperbolic metamaterial (HMM) is implemented by a multi-layered stack structure of a metal layer and a dielectric layer each having a sub-wavelength thickness. Permittivity and permeability of the HMM may be expressed as a tensor according to Equation (3) below:

$$\ddot{\epsilon} = \text{diag}(\epsilon_{xx}, \epsilon_{yy}, \epsilon_{zz}) = \text{diag}(\epsilon_{or}, \epsilon_{or}, \epsilon_{ex})$$

$$\ddot{\mu} = \text{diag}(\mu_{xx}, \mu_{yy}, \mu_{zz}) = \text{diag}(\mu_{or}, \mu_{or}, \mu_{ex})$$

Equation (3)

where $\epsilon_{or}$ and $\mu_{or}$ are ordinary parameters with respect to polarized light in an in-plane direction, and $\epsilon_{ex}$ and $\mu_{ex}$ are extraordinary parameters with respect to polarized light in an optical axis direction. The optical axis direction is a stack direction, and the in-plane direction is a direction perpendicularly to the stack direction. Referring to FIG. 1, the Z-axis represents an extraordinary direction, and a direction on an XY plane is an ordinary direction.

In the hyperbolic meta-structure, symbols of an ordinary variable and an extraordinary variable of permittivity are opposite, thereby resulting in strong anisotropy. Thus, when electromagnetic waves in a polarized state (a transverse magnetic (TM) mode) having electric field components in a direction of anisotropy are incident on the meta-structure 100, the meta-structure 100 has a strong birefringence property expressed as the following dispersion relation represented by Equation (4):

$$\frac{k_x^2 + k_y^2}{\epsilon_{ex}\mu_{or}} + \frac{k_z^2}{\epsilon_{or}\mu_{or}} = k_o^2$$

Equation (4)

To be applied to the meta-structure 100 employing the active layer 30 in the hyperbolic meta-structure, similar to the current exemplary embodiment, values of the variables included in the dispersion relation change. Because the carrier accumulation layers 32 and 36 are formed at a boundary surface between the dielectric layer 20 and the active layer 30 and a change of the carrier concentrations of the carrier accumulation layers 32 and 36 is induced depending on a DC bias voltage applied between the active layer 30 and the metal layer 10, boundary conditions of the Maxwell equations vary at the boundary surface. This configuration changes effective optical variables of the meta-structure 100.

The carrier concentrations of the carrier accumulation layers 32 and 36 formed on the active layer 30 change so that the optical variables of the meta-structure 100 may be tuned. In this regard, the meta-structure 100 of FIG. 1 may be referred to as a tunable HMM.

Figure 2A:
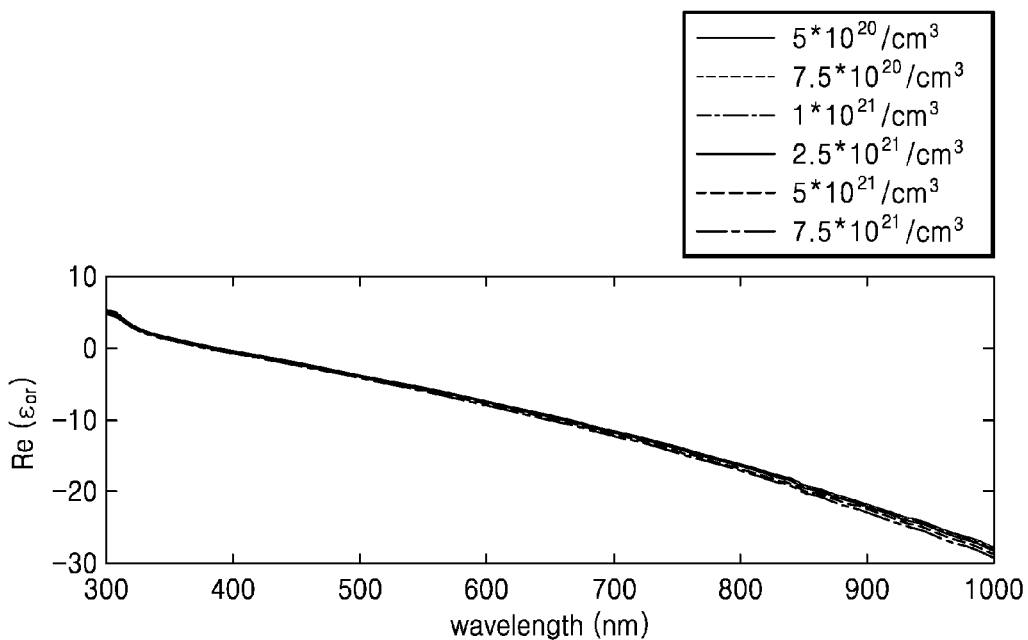
FIGS. 2A and 2B are graphs showing computer simulations of a real part and an imaginary part of ordinary permittivity depending on a change of a carrier concentration of an active layer in the meta-structure illustrated in FIG. 1.
Figure 2B:
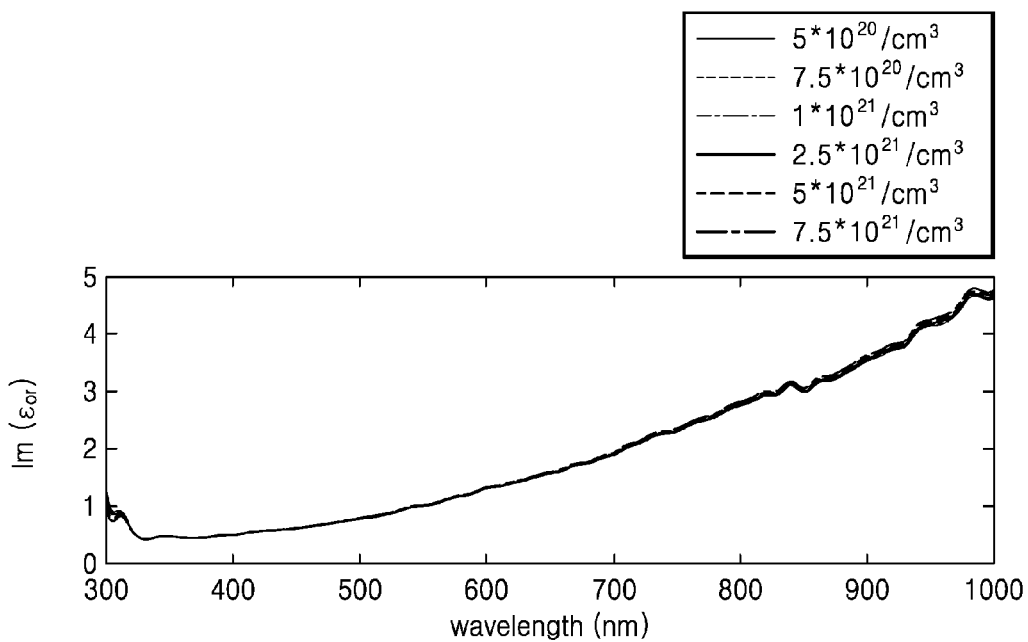

FIGS. 2A and 2B are graphs showing computer simulations of a real part and an imaginary part of ordinary permittivity depending on a change of a carrier concentration of the active layer 30 in the meta-structure 100 illustrated in FIG. 1.

Figure 3A:
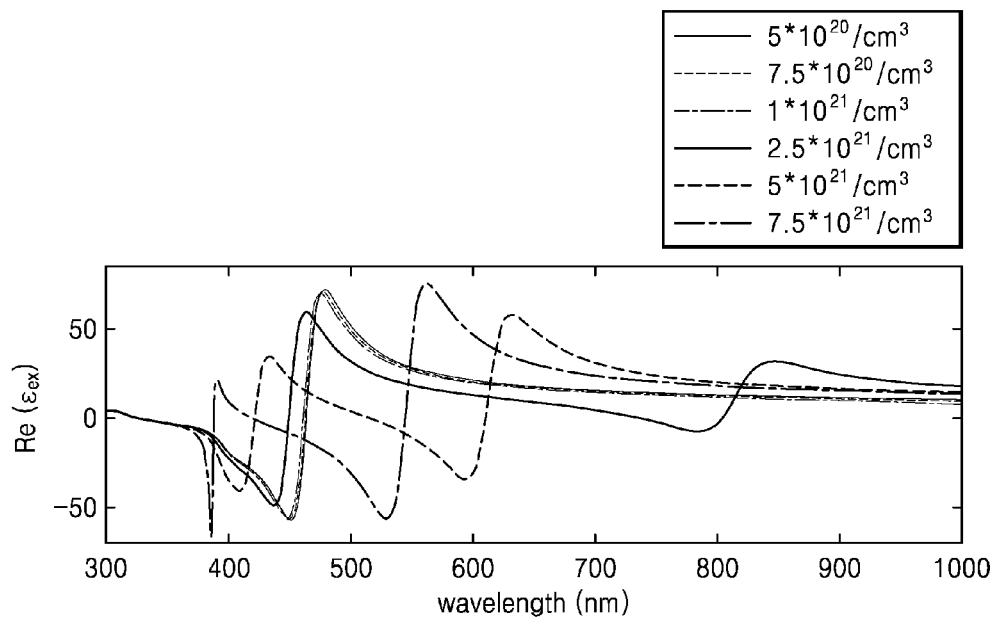
FIGS. 3A and 3B are graphs showing computer simulations of a real part and an imaginary part of extraordinary permittivity depending on a change of a carrier concentration of the active layer in the meta-structure of FIG. 1.
Figure 3B:
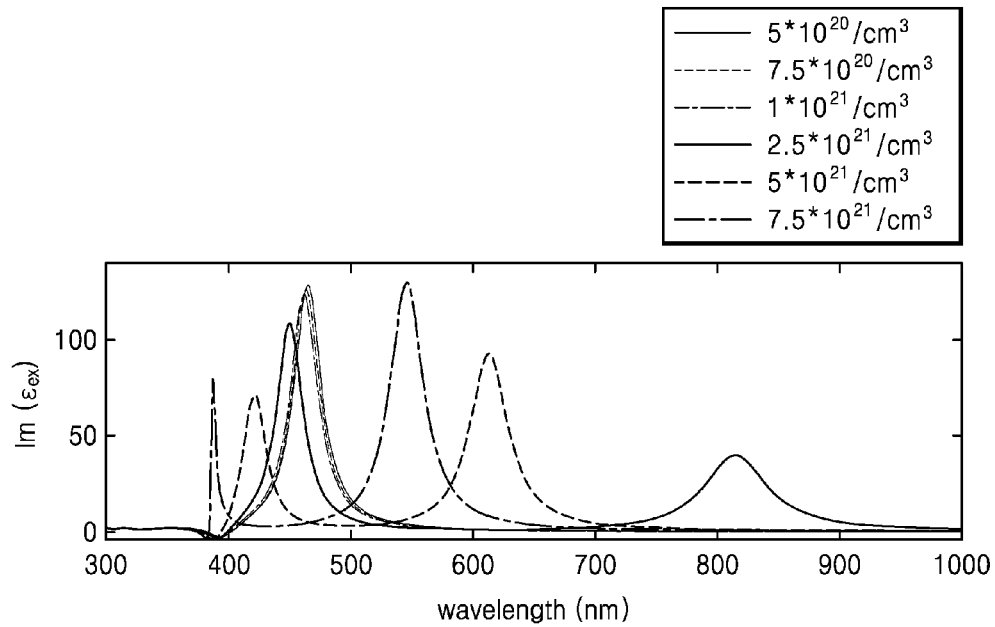

FIGS. 3A and 3B are graphs showing computer simulations of a real part and an imaginary part of extraordinary permittivity depending on a change of a carrier concentration of the active layer 30 in the meta-structure 100 of FIG. 1.

Figure 4A:
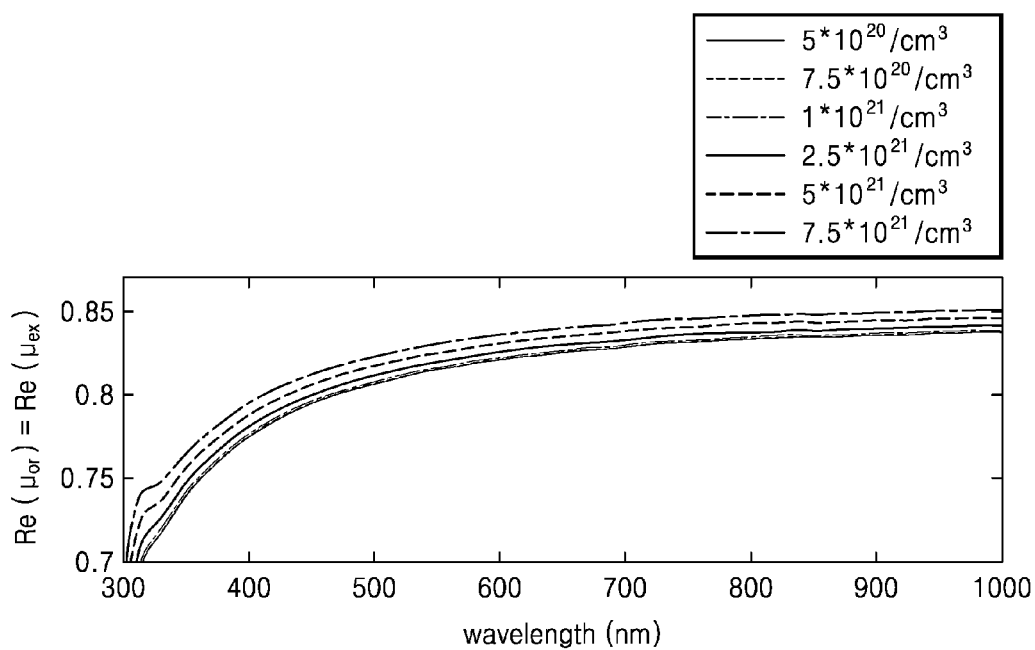
FIGS. 4A and 4B are graphs showing computer simulations of a real part and an imaginary part of permeability depending on a change of a carrier concentration of the active layer in the meta-structure of FIG. 1.
Figure 4B:
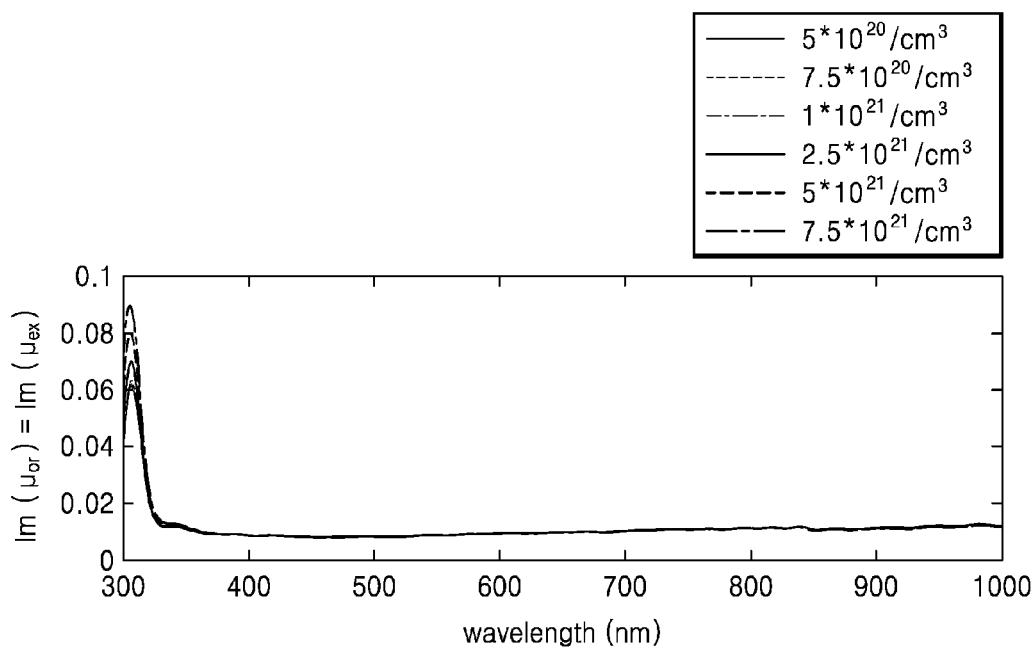

FIGS. 4A and 4B are graphs showing computer simulations of a real part and an imaginary part of permeability depending on a change of a carrier concentration of the active layer 30 in the meta-structure 100 of FIG. 1.

Referring to FIGS. 2A and 2B, a change of ordinary permittivity depending on the carrier concentration is minute. This result is because the effect of the metal layer 10 on an in-plane response of the meta-structure 100 is superior to the effect of the carrier accumulation layers 32 and 36 on the in-plane response of the meta-structure 100.

Referring to FIGS. 4A and 4B, in the case of permeability, an extraordinary variable and an ordinary variable are the same. This indicates that the effect of the meta-structure 100 on a magnetic parameter is minute. Also, a change of permeability depending on a change of the carrier concentration is minute.

Referring to FIGS. 2A, 2B, 3A, 3B, 4A, and 4B, a most tunable optical variable is extraordinary permittivity $\epsilon_{ex}$ illustrated in FIGS. 3A and 3B. A change of extraordinary permittivity $\epsilon_{ex}$ may affect birefringence, dichroism, and an optical band gap of the meta-structure 100.

Referring to FIGS. 3A and 3B, as the carrier concentration is tuned from $5*10^{20}/cm^3$ to $7.5*10^{21}/cm^3$, the position of Lorentzian-shaped resonance is moved to a blue wavelength band. The position of an epsilon near pole (ENP) wavelength is moved to a blue wavelength band of about 60 nm or more. The ENP wavelength refers to a wavelength in which permittivity is infinite, and here, indicates a wavelength in which permittivity is a maximum. The ENP wavelength in the illustrated carrier concentration range is maintained in a visible ray range. When the carrier concentration is high, e.g., when the carrier concentration is $2.5*10^{21}/cm^3$, $5*10^{21}/cm^3$, or $7.5*10^{21}/cm^3$, secondary resonance also occurs.

Tunability of the optical variable may be represented as tunable birefringence and tunable dichroism.

The meta-structure 100 represents strong birefringence and dichroism with respect to the polarized state (a TM or TE mode) of the incident electromagnetic waves according to Equation 4.

Birefringence refers to a phenomenon that electromagnetic waves in two different polarized states are refracted in two different directions. Thus, birefringence relates to different propagation speed of electromagnetic waves in a medium depending on each polarized state and relates to a refractive index, in particular, the real part of permittivity. Birefringence may be defined according to Equation (5) as follows:

$$Re(\sqrt{\epsilon_{or}\mu_{or}}) - Re(\sqrt{\epsilon_{ex}\mu_{ex}})$$

Equation (5)

Dichroism refers to a phenomenon that electromagnetic waves represent two different colors depending on polarized states of the electromagnetic waves. Dichroism relates to absorption of the electromagnetic waves in the medium and thus relates to the imaginary part of permittivity. Dichroism may be defined according to Equation (6) as follows:

$$Im(\epsilon_{ex}\mu_{ex}) - Im(\epsilon_{or}\mu_{or})$$

Equation (6)

Figure 5A:
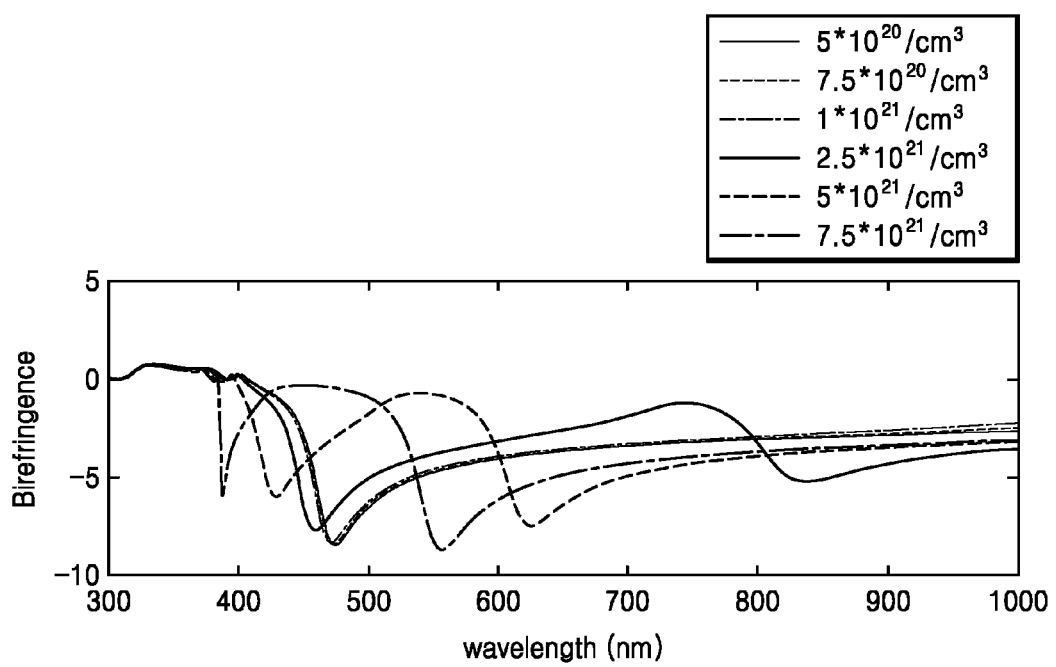
FIGS. 5A and 5B are graphs showing computer simulations of a change of birefringence and dichroism depending on a change of a carrier concentration of the active layer in the meta-structure of FIG. 1.
Figure 5B:
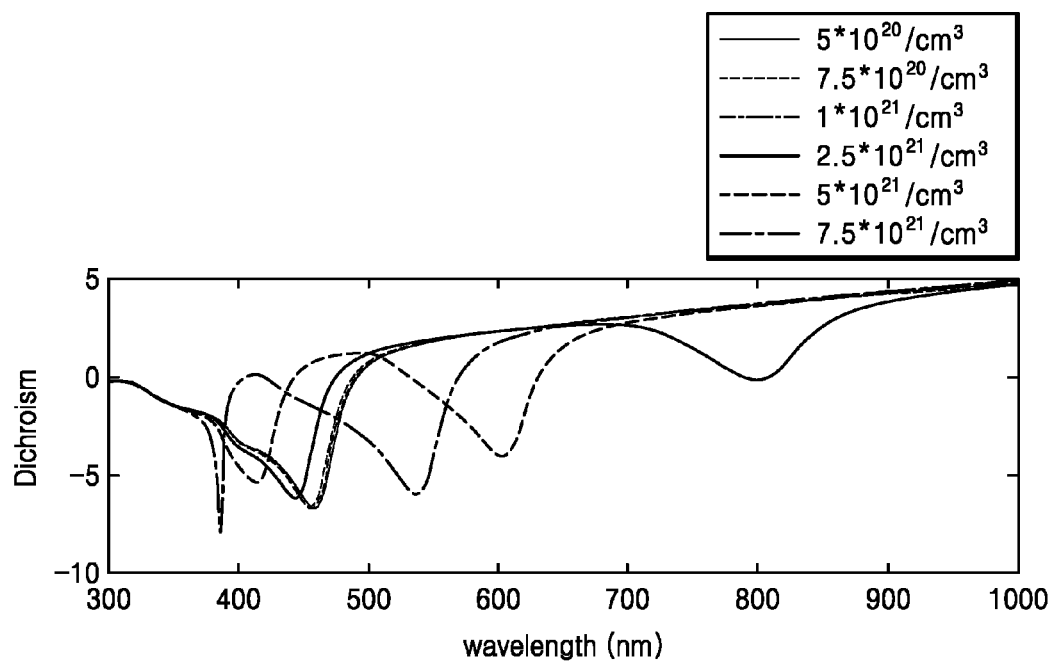

FIGS. 5A and 5B are graphs showing computer simulations of a change of birefringence and dichroism depending on a change of a carrier concentration of the active layer 30 in the meta-structure 100 of FIG. 1.

Referring to the graphs, values that represent birefringence and dichroism change in various ways depending on a change of a carrier concentration in a visible ray wavelength band.

The following Table 1 shows birefringence values of anisotropic materials that are found in nature:

TABLE 1

| Material | Birefringence |
|---|---|
| $Al_2O_3$ | 0.008 |
| Calcite | 0.172 |
| Lithium Niobate | 0.085 |
| Rutile | 0.287 |
| Nematic liquid crystal | ~0.4 |

Comparing FIG. 5A with the above Table 1, the magnitude of birefringence that occurs in the meta-structure 100 is remarkably larger than birefringence of the anisotropic materials that are found in nature. Also, it is noticeable that birefringence and dichroism are distributed in all regions of the visible ray wavelength band. This indicates that birefringence may be tuned with respect to light having a desired wavelength in the visible ray wavelength band.

Due to the tunable range of birefringence, birefringence may be implemented with a phase change value in the range of 0 to $2\pi$. Also, due to a resonance property of birefringence, a narrow band tunable waveplate may be implemented.

Also, due to the tunable range of dichroism, a wavelength tunable polarizer may be implemented.

The above-described result is the result of a computer simulation in which ITO is used as a material for the active layer 30. By using various materials for the active layer 30, the tunable range of the meta-structure 100 may be extended from the visible ray band to a near-infrared ray range and a far-infrared ray range. For example, the material for the active layer 30 may be a doped semiconductor material, and the doping state and concentration of the active layer 30 may be properly controlled so that the tunable band may be changed into a far-infrared ray region.

The meta-structure 100 may have a tunable figure of merit (FOM) and tunable bandgap characteristics. The shape or type of a dispersion surface is very rapidly tuned depending on a voltage applied to the meta-structure 100.

An area surrounded by the dispersion surface is in proportion to the entire number of available optical states. The area is rapidly tuned depending on the carrier concentrations of the carrier accumulation layers 32 and 36. By using the area, a density of optical state (DOS) of the meta-structure 100 may be controlled.

FOM may be defined according to Equation (7) as follows:

$$FOM = \frac{Re(k_{x,eff})}{Im(k_{x,eff})},\quad \text{Equation (7)}$$

where $k_{x,eff}$ is an x-component of an effective wave number vector in the medium, e.g., a component in the in-plane direction of the meta-structure 100.

Because propagation of the electromagnetic waves in the medium is represented as the real part of the wave number vector, as values of FOM increase, the number of optical states, in which the electromagnetic waves incident on the meta-structure 100 may exist in the meta-structure 100, increases.

Figure 6A:
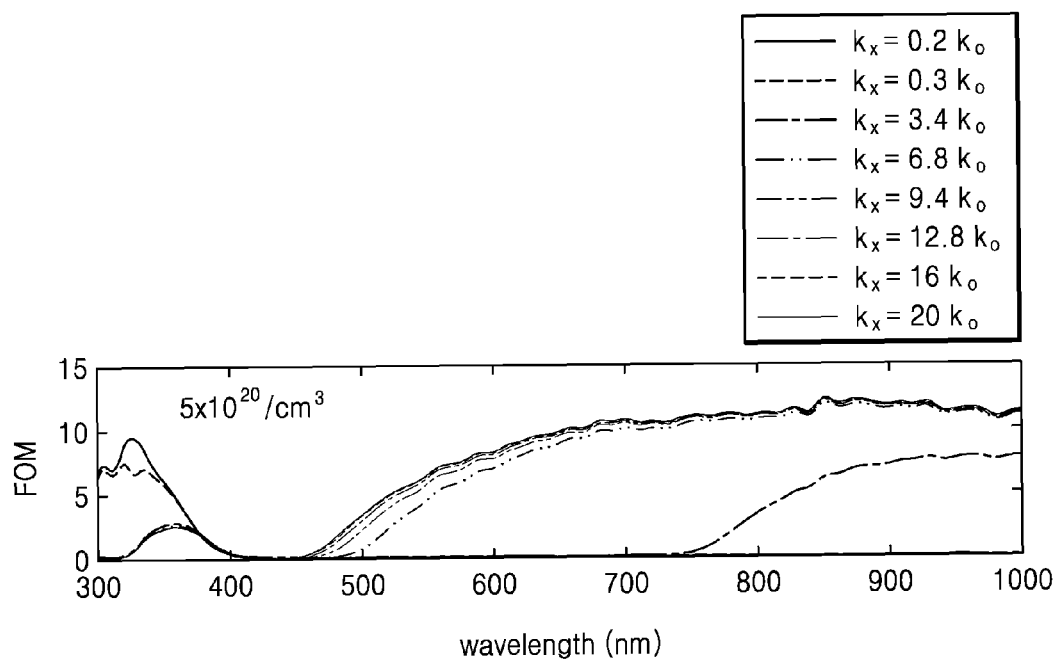
FIGS. 6A, 6B, and 6C are graphs showing computer simulations of figure of merit (FOM) depending on wavelengths of electromagnetic waves incident on the meta-structure of FIG. 1 with respect to three carrier concentrations of the active layer, respectively.
Figure 6B:
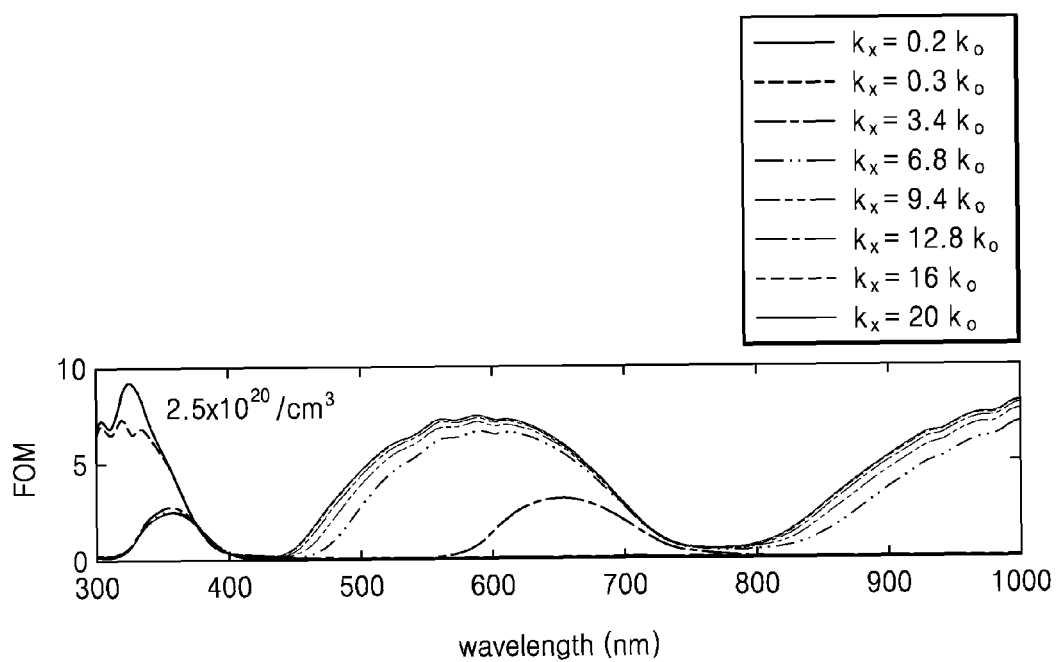
Figure 6C:
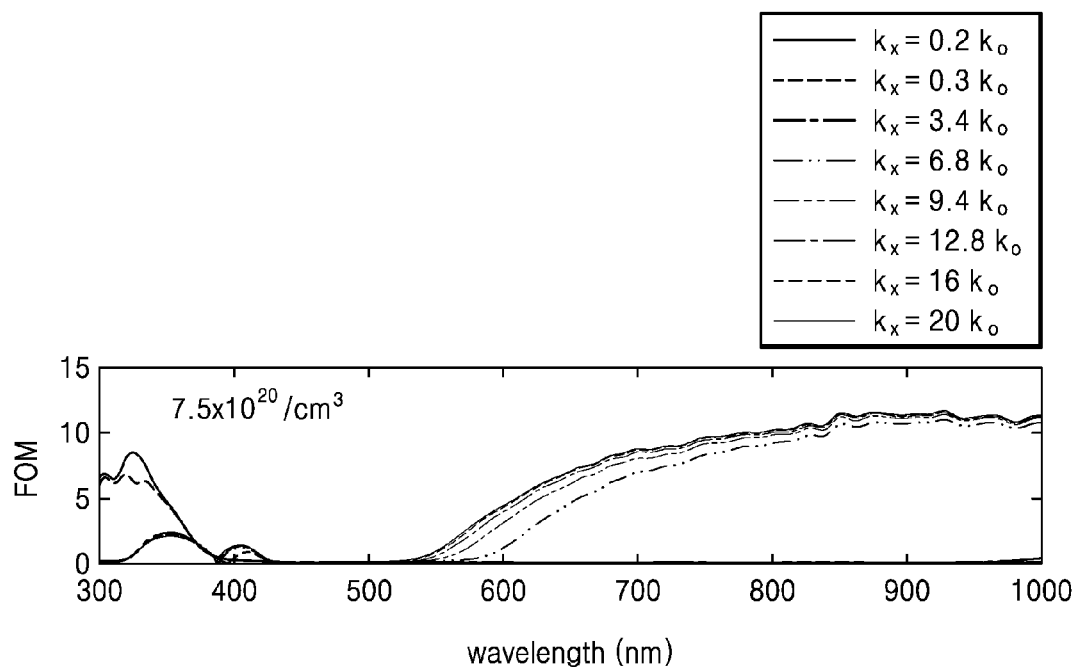

FIGS. 6A, 6B, and 6C are graphs showing computer simulations of figure of merit (FOM) depending on wavelengths of electromagnetic waves incident on the meta-structure 100 of FIG. 1 with respect to three carrier concentrations of the active layer 30, respectively.

In the graphs, $k_0$ is the magnitude of an electromagnetic wave number vector in air.

The values of FOM in the graphs represent very large values, compared to the existing meta-structure. Valleys and ridges on the graphs change rapidly depending on an applied voltage, e.g., a carrier concentration. Positions of the valleys and the ridges correspond to the case where all of the denominators of Equation 4 have negative symbols and opposite symbols, respectively. The valleys and the ridges represent a band gap and hyperbolic dispersion, respectively.

The ridges represent a state in which propagation of the electromagnetic waves is enhanced, and represent an increase in DOS. On the other hand, the valleys represent a state in which propagation of the electromagnetic waves is suppressed and refer to disappearance of DOS. When DOS is 0, propagation of the electromagnetic waves in the meta-structure 100 is completely suppressed, and refers to an omnidirectional reflective band gap.

Referring to FIG. 6A, when a bias voltage is 0, e.g., when the carrier concentration is $5*10^{20}/cm^3$, the meta-structure 100 forms three discrete wavelength regions.

Kx is a wave number vector component of light incident on the meta-structure 100 that is parallel to the boundary surface of the metal-structure 100, and for example, represents the magnitude of an x-component using a wave number Ko in the air and corresponds to an angle of incidence. When kx is 0, light is incident perpendicularly to the boundary surface, and 1ko represents a response to light incident parallel to the boundary surface, e.g., light having an angle of incidence of 90°. When kx is greater than ko, kx corresponds to a near-field component in the air, and when FOM is not 0, energy with this component may be transferred through the meta-structure 100. This feature may be utilized in controlling a light excitation state in a small light-emitting body in an optical memory device in a quantum state.

In FIG. 6A, FOM is large in a wavelength region between about 300 nm and about 400 nm, and the wavelength region represents a type I hyperbolic dispersion property.

In the following region, FOM is almost 0. The following region is a region corresponding to an omnidirectional reflective band gap. This region is a region in which no optical state is present, e.g., a suppressed DOS region.

A type II hyperbolic dispersion region is a long wavelength region in which FOM increases again.

Referring to FIGS. 6B and 6C, as the carrier concentration is tuned, the shape of an FOM graph is tuned, and positions of three regions described above also change. Referring to the graph of FIG. 6B in which a carrier concentration is $2.5*10^{20}/cm^3$, a new effective band gap region is formed in a long wavelength region having a wavelength of about 740 nm to about 810 nm. This feature is the result of secondary resonance of $Re(\in_{ex})$ as illustrated in FIG. 3A. Referring to the graph of FIG. 6C, the position of the band gap is moved to the blue wavelength band in a carrier concentration of $7.51*10^{20}/cm^3$.

As the carrier concentration is tuned, FOM represents a value that is equal to or greater than 10. This value is much greater than 1 to 3 that are values found in a conventional meta-structure.

Figure 7A:
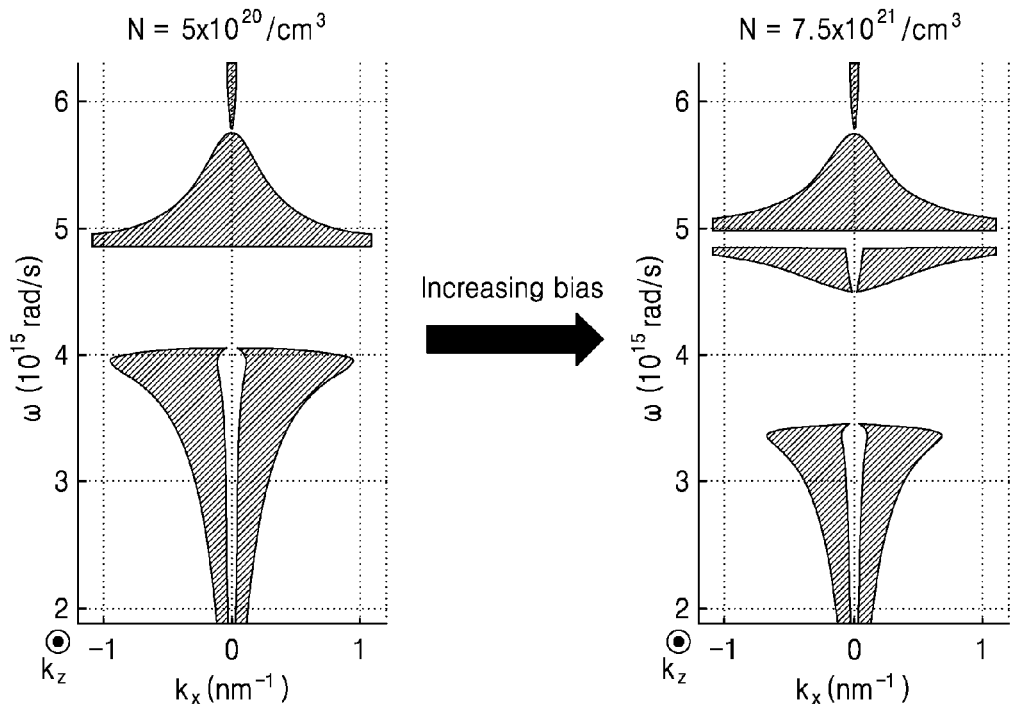
FIGS. 7A and 7B are graphs showing computer simulations of a change of a dispersion surface shape depending on a carrier concentration of the active layer in the meta-structure of FIG. 1 on a $k_x$-ω plane and a $k_z$-ω plane, respectively.
Figure 7B:
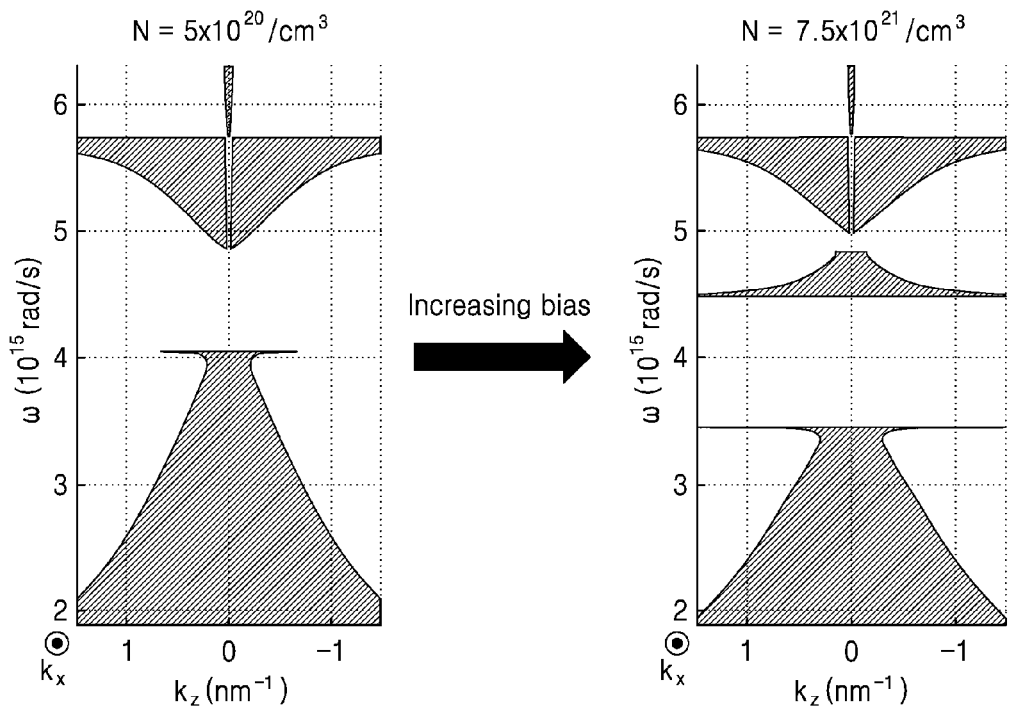

FIGS. 7A and 7B are graphs showing computer simulations of a change of a dispersion surface shape depending on a carrier concentration of the active layer 30 in the meta-structure 100 of FIG. 1 on a $k_x$-ω plane and a $k_z$-ω plane, respectively.

In the graphs of FIGS. 7A and 7B, for convenience of calculation, it is assumed that $k_y$ is 0, and this assumption is because behaviors of $k_x$ and $k_y$ that are in-plane components are symmetrical to each other and thus are the same. The graph of FIG. 7A shows dispersion surfaces in a $k_z$ axis direction, and the graph of FIG. 7B shows dispersion surfaces in a $k_x$-axis direction.

Referring to FIGS. 7A and 7B, regions that are not surrounded by dispersion surfaces, e.g., regions in which there are no hatched-lines, form a band gap. The position or shape of the band gap is tuned according to an applied voltage. Also, when the carrier concentration increases, a new effective band gap occurs. This feature is because permittivity of the active layer 30 is greatly tuned due to a field effect and wavelength shift of a hyperbolic region and a band gap occurs. Furthermore, generation of a secondary band gap represents that opening or closing of the band gap is possible.

As shown in Equation 1 described above, a tunability range may be defined as N*d. d is a Debye length of the active layer 30, and N is a carrier concentration of the active layer 30. d may also be thicknesses of the carrier accumulation layers 32 and 36. Because $\epsilon_{ex}$ is an optical variable having the most change due to an electric field effect, sensitivity of a change of ENP wavelengths of $\epsilon_{ex}$ will be described with a function of N or d.

Figure 8A:
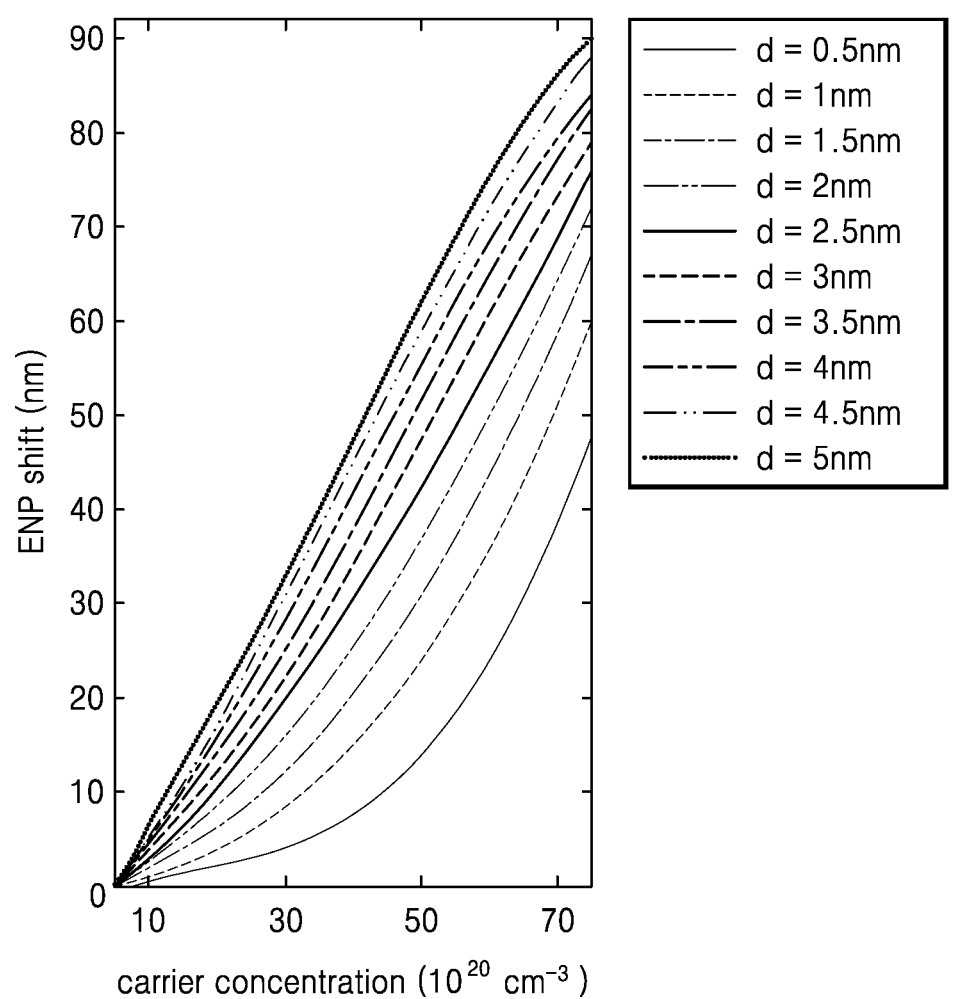
FIGS. 8A and 8B are graphs showing computer simulations of epsilon near pole (ENP) shift depending on a change of a carrier concentration of the active layer and ENP shift depending on a change of a Debye length in the meta-structure of FIG. 1.
Figure 8B:
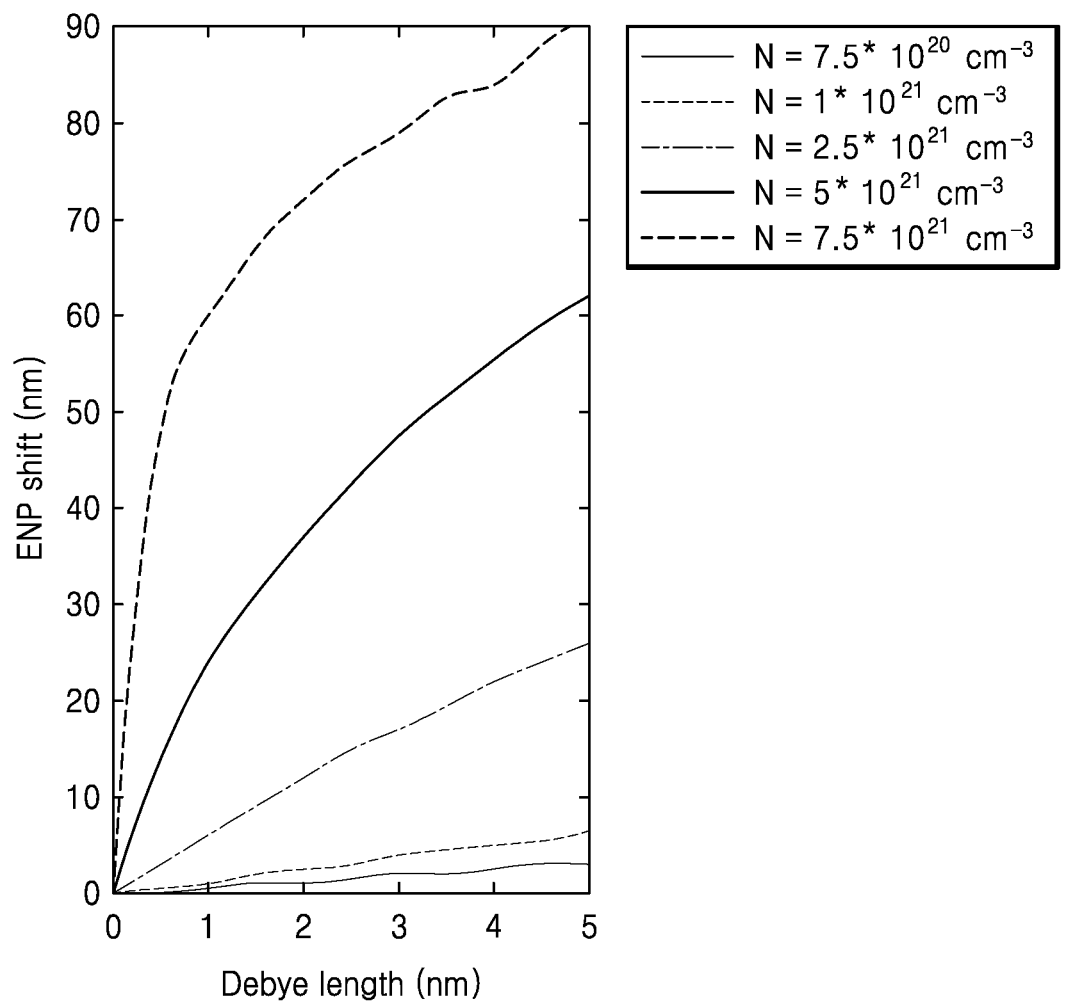

FIGS. 8A and 8B are graphs showing computer simulations of epsilon near pole (ENP) shift depending on a change of a carrier concentration of the active layer 30 and ENP shift depending on a change of a Debye length in the meta-structure 100 of FIG. 1.

Referring to FIGS. 8A and 8B, the most important factor that affects a change of ENP wavelengths is a carrier density. It is expected that the change of ENP wavelengths of the meta-structure 100 may cause a significant change in photoluminescence or cathodoluminescence performance.

The most important factor that affects controlling of birefringence, dichroism, and an effective band structure of the meta-structure 100, is secondary resonance of $\epsilon_{ex}$, as illustrated in FIGS. 3A and 3B. In order to examine this characteristic in more detail, the effect that the Debye length and the carrier concentration affect a change $|\Delta\epsilon_{ex}|_{rel}$ of the real part of $\epsilon_{ex}$ will be described.

$|\Delta\epsilon_{ex}|_{rel}$ represents a change of extraordinary permittivity due to an applied voltage and is defined as $|\epsilon_{ex\_0V} - \epsilon_{ex}|/\epsilon_{ex\_0V}$.

Figure 9A:
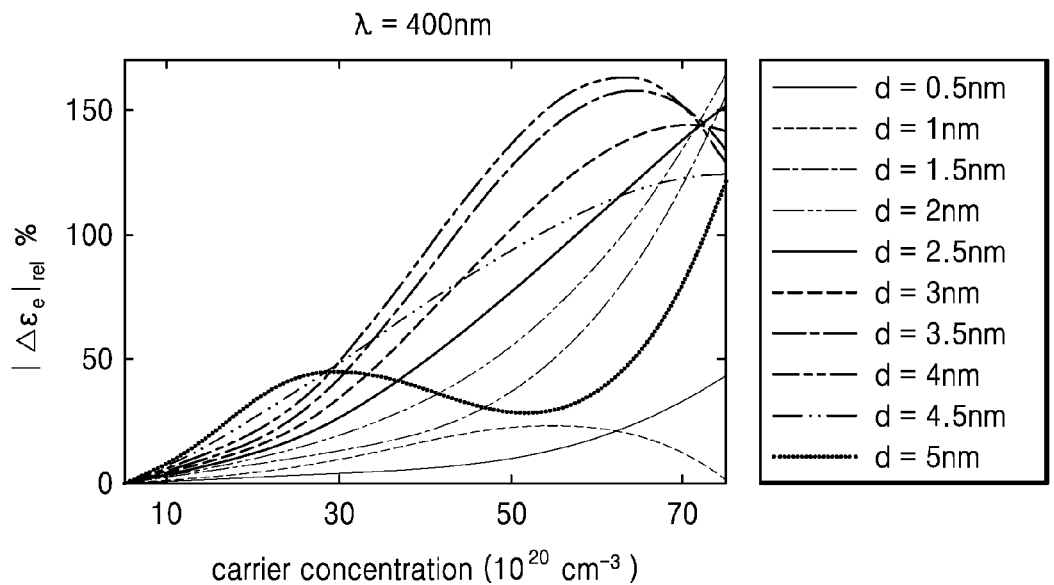
FIGS. 9A, 9B, and 9C are graphs showing computer simulations of a rate of change of extraordinary permittivity depending on a change of a carrier concentration of the active layer in the meta-structure of FIG. 1 with respect to three wavelengths, respectively.
Figure 9B:
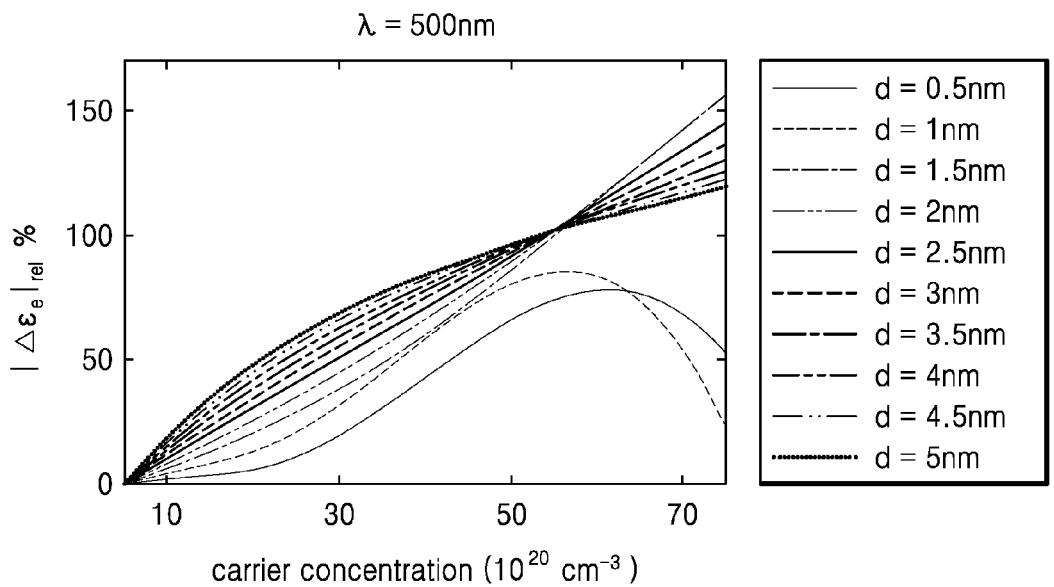
Figure 9C:
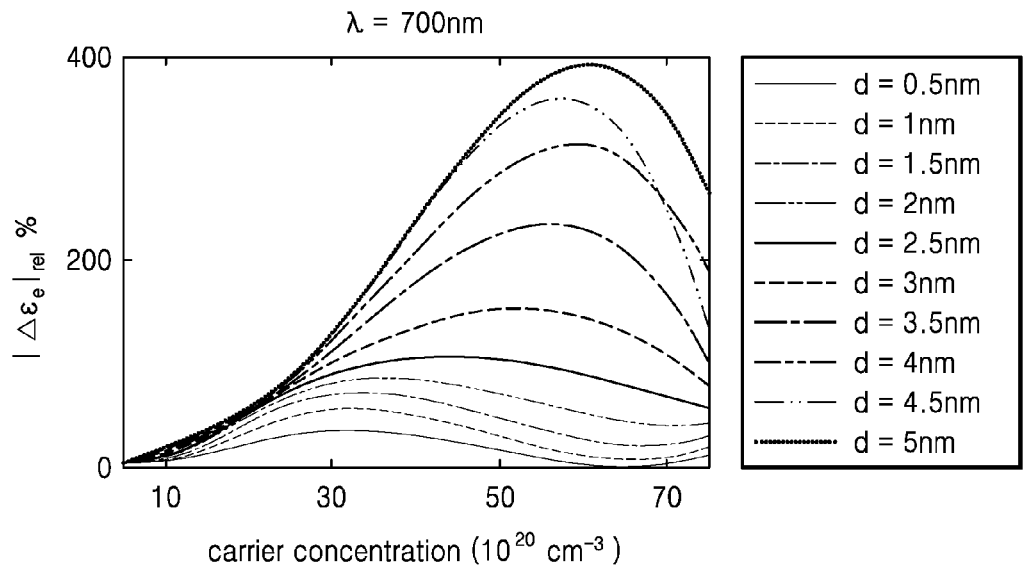

FIGS. 9A, 9B, and 9C are graphs showing computer simulations of a rate of change of extraordinary permittivity depending on a change of a carrier concentration of the active layer 30 in the meta-structure 100 of FIG. 1 with respect to three wavelengths λ, respectively.

Referring to FIGS. 9A, 9B, and 9C, as the Debye length is tuned by 0.5 nm, $|\epsilon_{ex}|_{rel}$ represents a change of 20% to 100%. It is thought that such a great change is due to secondary resonance of $\epsilon_{ex}$.

Figure 10A:
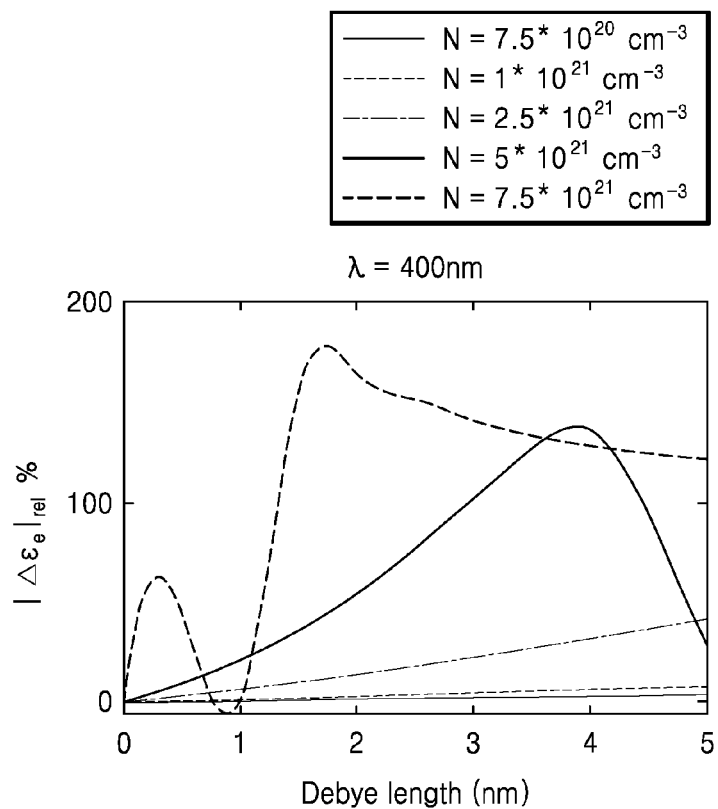
FIGS. 10A, 10B, and 10C are graphs showing computer simulations of a rate of change of extraordinary permittivity depending on a change of a Debye length of the active layer in the meta-structure of FIG. 1 with respect to three wavelengths, respectively.
Figure 10B:
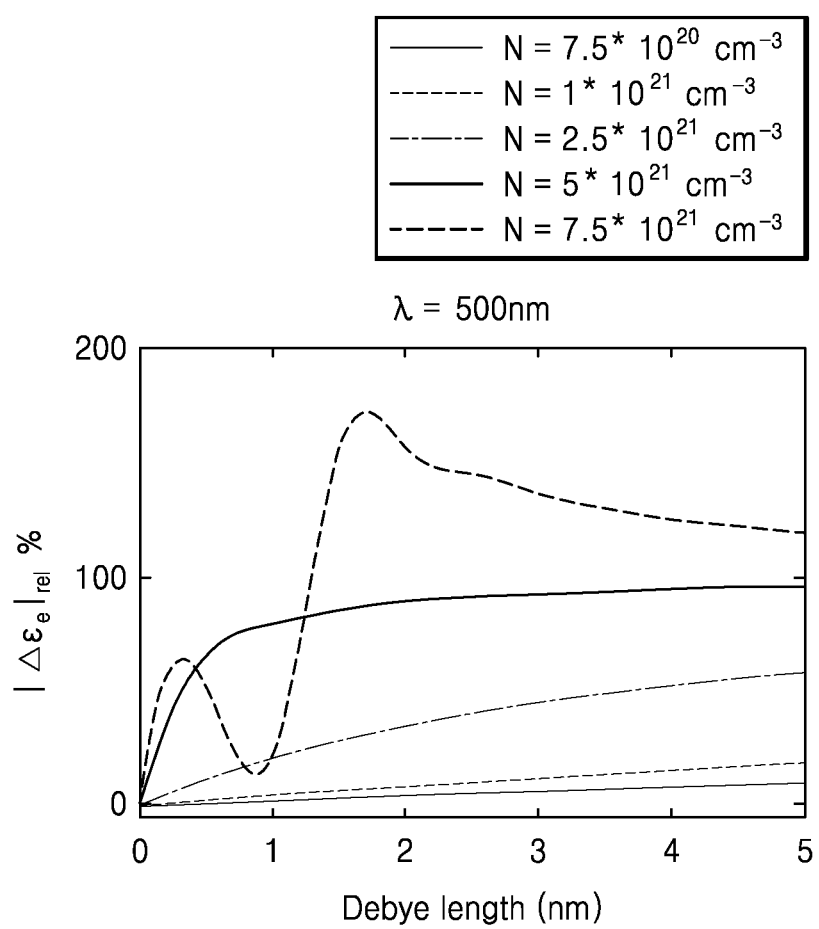
Figure 10C:
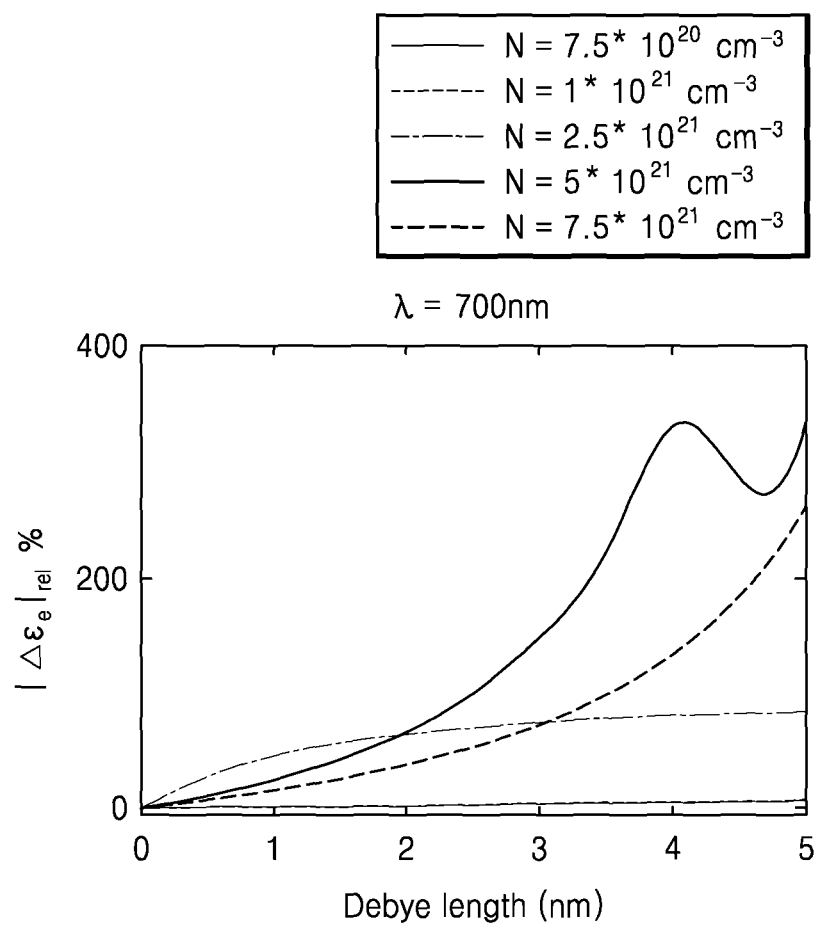

FIGS. 10A, 10B, and 10C are graphs showing computer simulations of a rate of change of extraordinary permittivity depending on a change of a Debye length of the active layer 30 in the meta-structure 100 of FIG. 1 with respect to three wavelengths λ, respectively.

Referring to FIGS. 10A, 10B, and 10C, as the carrier concentration increases, for example, when the carrier concentration increases by 10 times, $|\Delta\epsilon_{ex}|_{rel}$ represents a change of 150% to 350%.

As described above, in the meta-structure 100 of FIG. 1, there are many types of optical performances depending on the carrier concentration of the active layer 30 tuned due to an electric field effect, and a dynamic range thereof is very diverse. Thus, the meta-structure 100 of FIG. 1 may be applied to various optical devices. Hereinafter, exemplary embodiments of an optical device including the meta-structure 100 illustrated in FIG. 1 will be described.

Figure 11:
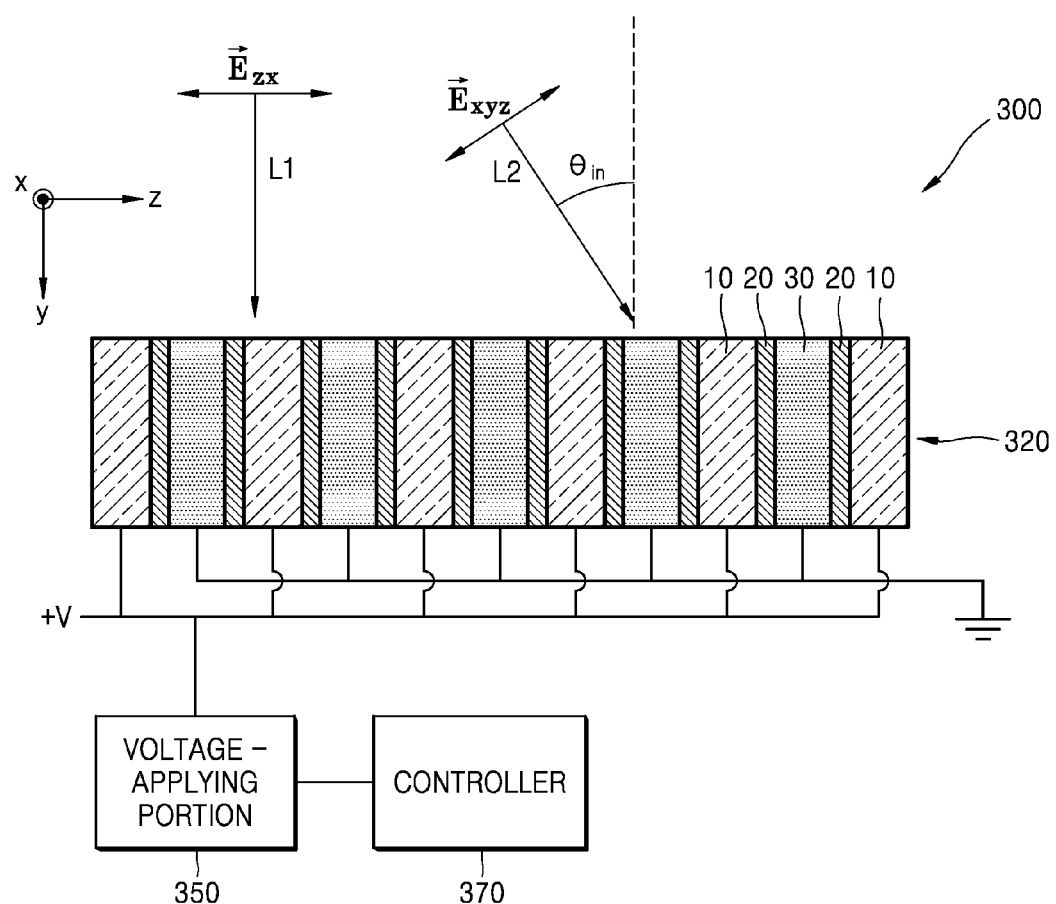
FIG. 11 is a cross-sectional view illustrating a schematic configuration of a tunable optical device according to an exemplary embodiment.

FIG. 11 is a cross-sectional view illustrating a schematic configuration of a tunable optical device 300 according to an exemplary embodiment.

The tunable optical device 300 includes a meta-structure 320, a voltage-applying portion 350 that applies a voltage to the meta-structure 320, and a controller 370 that controls a voltage to be applied to the meta-structure 320 by the voltage-applying portion 350.

The meta-structure 320 includes a metal layer 10, a dielectric layer 20, an active layer 30, a dielectric layer 20, and a metal layer 10, and has a stack structure in which the above order is repeated in one direction. The number of times that the order is repeated is exemplarily shown as four times in FIG. 11, but exemplary embodiments are not limited to the illustrated number of times. Materials for the metal layer 10, the dielectric layer 20, and the active layer 30 included in the meta-structure 320 are as illustrated in FIG. 1, and materials for metal layers 10, dielectric layers 20, and active layers 30 in different positions are not limited to the same materials.

The voltage-applying portion 350 may apply a voltage between the active layer 30 and the metal layer 10. A plurality of active layers 30 may be grounded, and voltages may be applied to a plurality of metal layers 10 with the same electric potentials, and exemplary embodiments are not limited thereto.

The controller 370 controls a voltage to be applied between the active layer 30 and the metal layer 10 by the voltage-applying portion 350 depending on an optical property to be controlled by the meta-structure 320.

The meta-structure 300 may represent a great variety of optical performances depending on the voltage applied between the active layer 30 and the metal layer 10, as described above, and a tunability range of the optical property of the tunable optical device 300 may be tuned in various ways depending on the range of a voltage set by the controller 370.

The tunable optical device 300 may be used as an electrically tunable filter or polarization plate. When the direction of an electric field is on an xz-plane and light L1 is incident perpendicularly to the meta-structure 300, the light L1 is coupled only to extraordinary permittivity of the meta-structure 320 having an electric field component, such as $E_{zx}$, and a displacement field D in the meta-structure 320 has the following value:

$$\vec{D}_{zx} = \epsilon_{ex} \vec{E}_{zx}$$

Extraordinary permittivity may be very elaborately controlled in consideration of the computer simulations shown in FIGS. 3A and 3B. By controlling an applied voltage, for example, the tunable optical device 300 may operate as an optical filter that transmits only light having a predetermined wavelength band, for example.

When light L2 that is incident on the meta-structure 100 at an angle (e.g., in a slanted direction) has an electric field component, such as $E_{xyz}$, the light L2 is coupled to extraordinary permittivity and ordinary permittivity in the meta-structure 100. Thus, with respect to the incident light L2, as illustrated in FIGS. 5A and 5B, birefringence and dichroism defined in equations 5 and 6 may be controlled. For example, by controlling birefringence, light may proceed only along a slow axis or fast axis, and by controlling dichroism, a loss of light in a particular electric field direction (polarized state) may be controlled.

Figure 12:
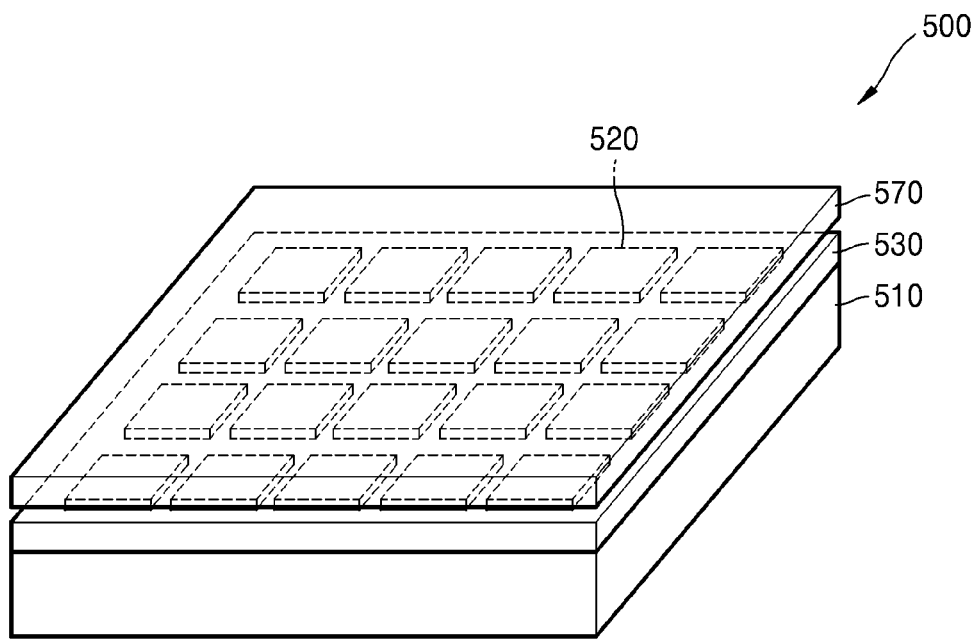
FIG. 12 is a perspective view illustrating a schematic configuration of a tunable optical device according to another exemplary embodiment.

FIG. 12 is a perspective view illustrating a schematic configuration of a tunable optical device 500 according to another exemplary embodiment.

The tunable optical device 500 may include a plurality of meta-structures 520 that are two-dimensionally arranged. Each of the plurality of meta-structures 520 may have a shape illustrated in FIG. 1 or 11.

The tunable optical device 500 may further include a circuit board 530 including a circuit element for applying a voltage to each of the plurality of meta-structures 520. Also, the tunable optical device 500 may further include a voltage-applying portion for applying a voltage to each of the meta-structures 520 through the circuit board 530 and a controller for controlling a voltage to be applied to each of the meta-structures 520 by the voltage-applying portion.

The tunable optical device 500 may include a first substrate 510, the circuit board 530, an array of the plurality of meta-structures 520, and a second substrate 570. The first substrate 510 and the second substrate 570 may be omitted. Alternatively, one of the first substrate 510 and the second substrate 570 may be an optical device that performs additional modulation on light incident on the meta-structures 520 or light emitted from the meta-structures 520.

Each of the meta-structures 520 may have a shape illustrated in FIG. 1 or 11, and a stack direction of a metal layer, a dielectric layer, and an active layer included in each of the meta-structures 520, e.g., a direction of an extraordinary axis of each of the meta-structures 520, is not specifically limited. The stack direction may be a direction in parallel to or perpendicularly to a surface on which the meta-structures 520 are arranged, depending on an optical property to be tuned.

Figure 13:
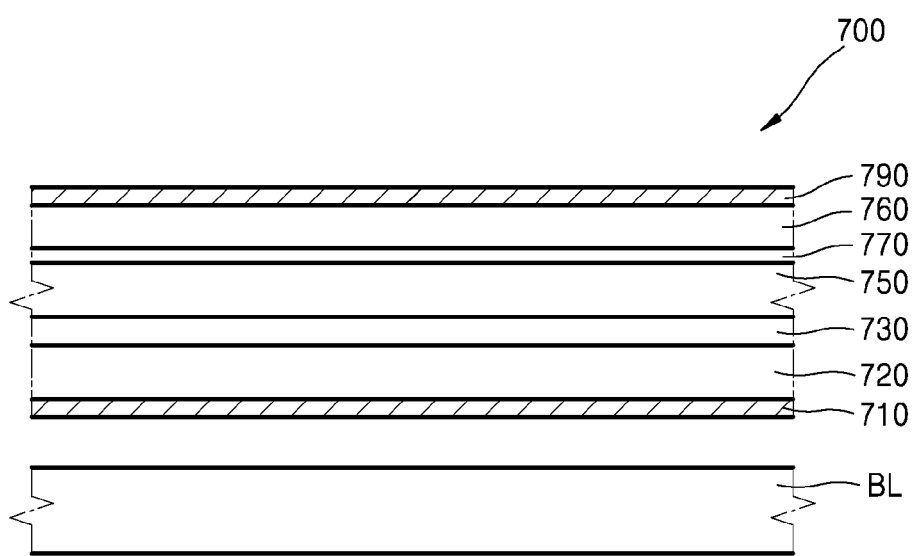
FIG. 13 is a cross-sectional view illustrating a schematic configuration of a display apparatus according to an exemplary embodiment.

FIG. 13 is a cross-sectional view illustrating a schematic configuration of a display apparatus 700 according to an exemplary embodiment.

The display apparatus 700 may have a shape in which a liquid crystal layer in an existing liquid crystal display (LCD) apparatus is replaced by the meta-structure 100 of FIG. 1. That is, an optical modulator 750 may include an array of meta-structures according to an exemplary embodiment that are two-dimensionally arranged. For example, the optical modulator 750 may include an array of meta-structures 520, as illustrated in FIG. 12.

The display apparatus 700 includes a lower substrate 720 having a first polarization plate 710, an upper substrate 760 having a second polarization plate 790, and the optical modulator 750 disposed between the lower substrate 720 and the upper substrate 760. A circuit board 730 including a circuit element for applying a voltage to each of a plurality of meta-structures disposed in the optical modulator 750 may be further formed on the lower substrate 720. The display device 700 may further include a voltage-applying portion for applying a voltage to each of the plurality of meta-structures disposed in the optical modulator 750 through the circuit board 730, and a controller for controlling a voltage to be applied to each of the meta-structures by the voltage-applying portion according to image information.

Also, a color filter 770 may be further disposed on the upper substrate 760. The color filter 770 may also be omitted.

The display apparatus 700 may include a backlight unit BL that provides light to be modulated by the optical modulator 760. When the display apparatus 700 is implemented with a reflective display that forms an image using external light, the backlight unit BL may also be omitted.

A procedure in which an image is displayed by the display apparatus 700 will be briefly described as below. Light provided by the backlight unit BL passes through the first polarization plate 710, is changed into a first polarized light and is incident on the optical modulator 750. A voltage to be applied to each of the plurality of meta-structures disposed in the optical modulator 750 is controlled according to information regarding an image to be displayed. A voltage through which birefringence of the meta-structures is controlled so that polarization of incident light is changed into second polarized light perpendicular to the first polarized light is applied to each of the meta-structures in a position corresponding to pixel on. The second polarized light emitted from the optical modulator 750 transmits through the second polarization plate 790. A voltage is applied to each of the meta-structures in a position corresponding to a pixel that is turned off so that birefringence is controlled and polarization of the incident light is maintained. The first polarized light emitted from the optical modulator 750 does not transmit the second polarization plate 790 but is absorbed thereinto. The above description is based on the case where polarization axis directions of the first polarization plate 710 and the second polarization plate 720 are perpendicular to each other. However, exemplary embodiments are not limited thereto, and the polarization axis directions of the first polarization plate 710 and the second polarization plate 720 may be the same polarization axis direction.

The display apparatus 700, in which the liquid crystal layer of an existing LCD display apparatus is replaced by the optical modulator 750 based on the meta-structure 100 of FIG. 1, may be easily packaged due to the solid-state nature of the meta-structure compared to an LCD having liquid nature. Also, the speed of accumulation and depletion of carriers in a carrier accumulation layer due to an electric field effect is very high, for example, approximately several pico-seconds, and the display apparatus 700 may have a fast response property compared to the LCD which has a response speed of, for example, several milliseconds.

The structure illustrated in FIG. 13 may operate as a device for controlling phase characteristics in addition to brightness information (image information) of light. This feature may be realized by properly controlling first and second polarization plates and an extraordinary optical axis direction of the meta-structure for controlling birefringence or anisotropy.

The meta-structure 100 of FIG. 1 may be used as an optical memory device, because an optical band gap may be opened or closed by the meta-structure 100. Quantum computing technologies may utilize controlling a tunable environment of quantum emitters (or quantum bits), e.g., controlling communication between the quantum emitters from the outside. The meta-structure 100 of FIG. 1 may provide a tunable environment to be controlled with respect to the quantum emitters.

Figure 14:
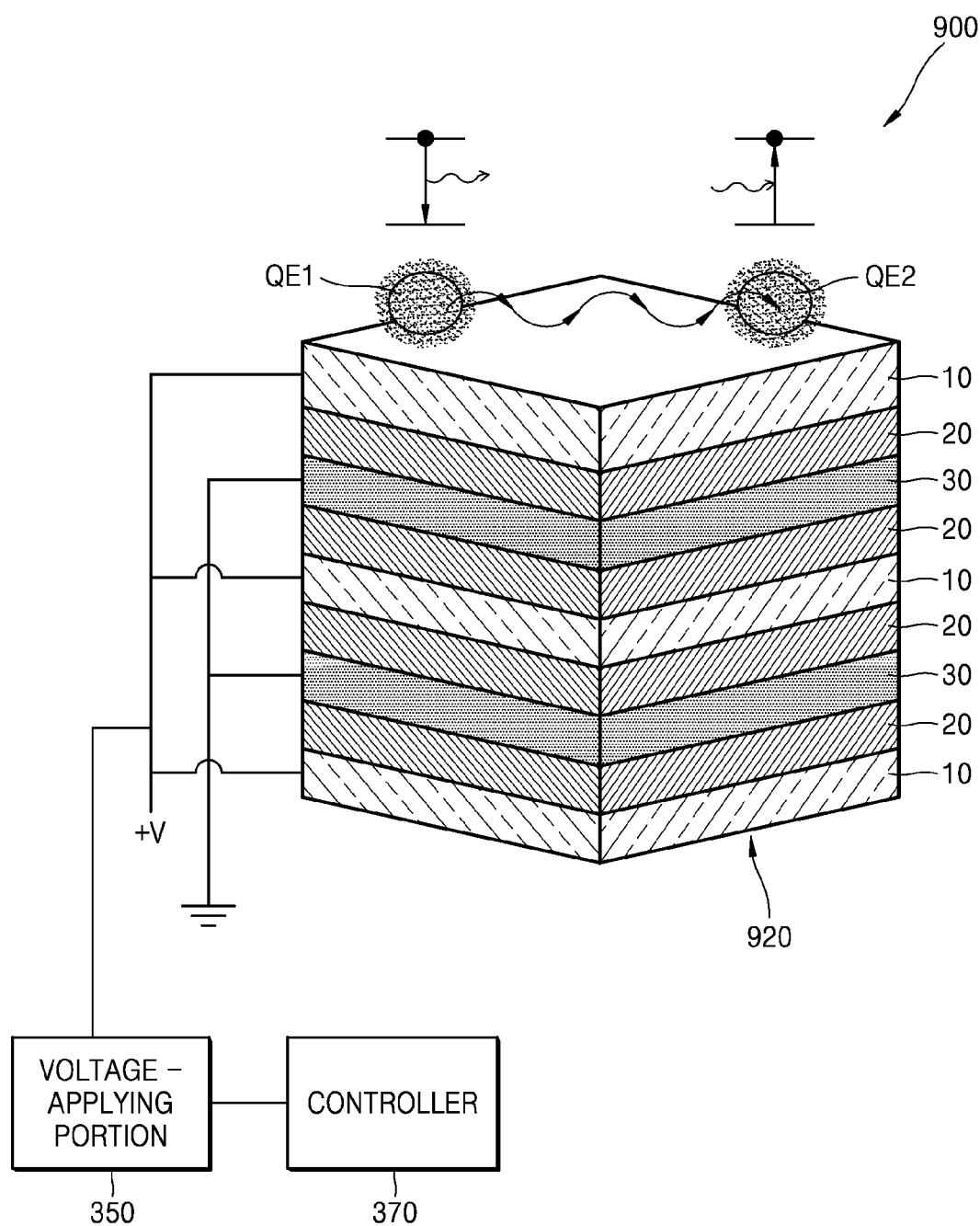
FIG. 14 is a view illustrating a schematic configuration of an optical memory device according to an exemplary embodiment.
Figure 15:
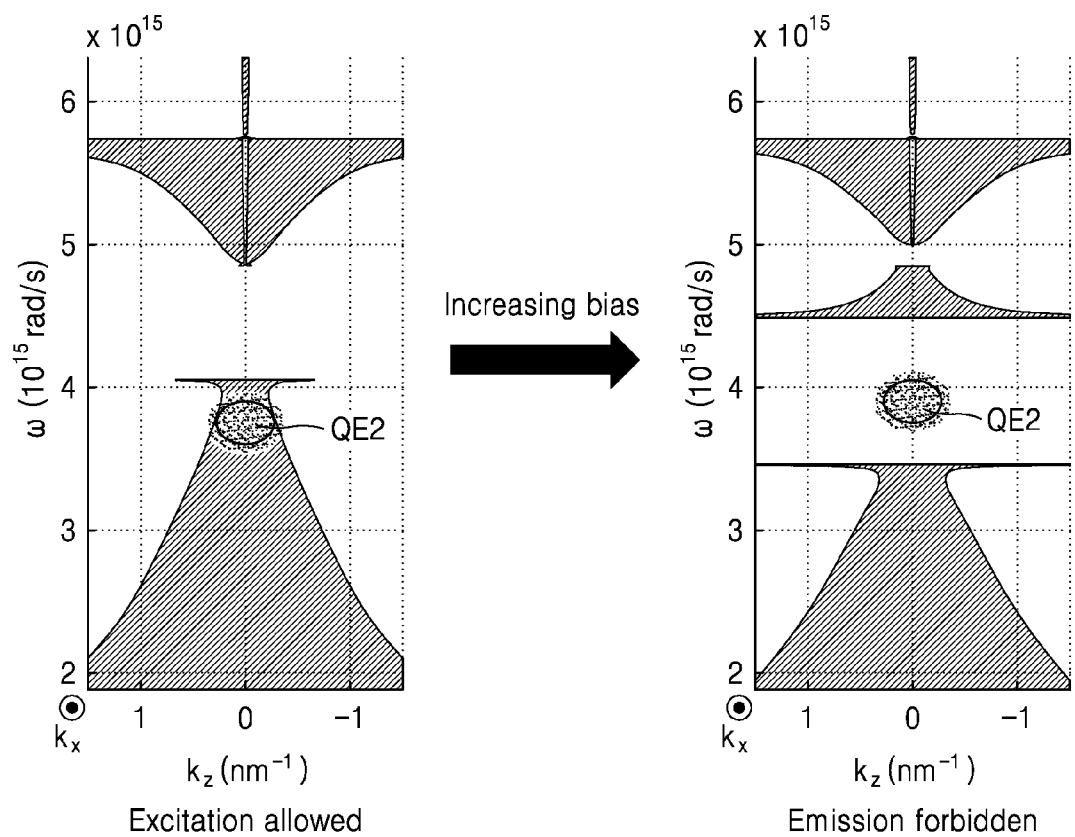
FIG. 15 is a conceptual view illustrating a principle in which a memory operation is performed by the optical memory device of FIG. 14.

FIG. 14 is a view illustrating a schematic configuration of an optical memory device 900 according to an exemplary embodiment, and FIG. 15 is a conceptual view for explaining a principle in which a memory operation is performed by the optical memory device 900 of FIG. 14.

Referring to FIG. 14, the optical memory device 900 includes a plurality of quantum emitters QE1 and QE2 in an environment of a meta-structure 920. The optical memory device 900 includes the meta-structure 920, and a first quantum emitter QE1 and a second quantum emitter QE2, which are disposed on the meta-structure 920. Positions of the first quantum emitter QE1 and the second quantum emitter QE2 are not limited to the illustrated positions. The first quantum emitter QE1 and the second quantum emitter QE2 may be disposed adjacent to the meta-structure 920 in various positions in which each of the first quantum emitter QE1 and the second quantum emitter QE2 may have an optical state controlled by the meta-structure 920. For example, the first quantum emitter QE1 and the second quantum emitter QE2 may be embedded in the meta-structure 920.

The meta-structure 920 includes a metal layer 10, a dielectric layer 20, an active layer 30, a dielectric layer 20, and a metal layer 10, which are sequentially stacked. The above layers may be repeatedly stacked once or more.

The optical memory device 900 further includes a voltage-applying portion 950 for applying a voltage to the meta-structure 920, and a controller 970 for controlling a voltage to be applied to the meta-structure 920 by the voltage-applying portion 950. The controller 970 may control the applied voltage so that an optical band gap of the meta-structure 920 may be tuned in a state in which the first quantum emitter QE1 or the second quantum emitter QE2 is excited in a particular optical state.

Referring to FIGS. 14 and 15, the memory operation of the optical memory device 900 will be described. Referring to FIG. 14, the first quantum emitter QE1 is in an excited state, is then lowered into a bottom state, and then emits optical signals. Due to the emitted optical signals, the second quantum emitter QE2 becomes excited. In the optical state in which the second quantum emitter QE2 is excited, for example, the second quantum emitter QE2 may occupy a position illustrated in the left graph of FIG. 15. That is, the second quantum emitter QE2 may have an excitation allowed state, e.g., a state represented by one of the hatched regions in the graph. This state may be a state in which a predetermined voltage is applied to the meta-structure 920 or no voltage is applied to the meta-structure 920. Next, an increased bias voltage is applied to the meta-structure 920. In this case, the applied bias voltage is a voltage in which a region in which the second quantum emitter QE2 is disposed is changed into an optical band gap region. As the bias voltage increases, a band structure of the meta-structure 920 may be tuned, as shown in the right graph of FIG. 15, and the second quantum emitter QE2 is disposed in the band gap region. In this state, the second quantum emitter QE2 is transited to the bottom state and is forbidden to emit optical energy. This feature is because all optical states to which the second quantum emitter QE2 may decay, disappear. Thus, the quantum state of the second quantum emitter QE2 is preserved as long as the voltage applied to the meta-structure 920 corresponds to the band gap. The second quantum emitter QE2 remains in the excited state.

Although, as the applied bias voltage increases, the shape of the band gap of the meta-structure 920 in the vicinity of the second quantum emitter QE2 is tuned and the quantum state of the second quantum emitter QE2 is preserved, this feature is exemplary only. The applied bias voltage is reduced compared to an initial bias voltage so that the quantum state of the second quantum emitter QE2 may be preserved.

Although several types of optical devices to which the above-described meta-structure is applicable have been described, the above-described meta-structure may be applied to various other types of optical devices, for example, polarizers, polarization cleanup modules, optical filters, sensors, and the like.

The above-described meta-structure may have characteristics of very high birefringence and dichroism due to a change of a carrier concentration of the active layer induced by an electric field effect.

A tunability range of birefringence and dichroism may be extended to various wavelength bands in addition to a visible ray wavelength band.

The above-described meta-structure has high efficiency and a fast response speed. Thus, the meta-structure may be applied to various optical devices, for example, polarizers, polarization cleanup modules, optical filters, sensors, display apparatuses, optical memory devices, and the like.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A meta-structure comprising:
   a plurality of metal layers spaced apart from one another;
   an active layer spaced apart from the plurality of metal layers and having a carrier concentration that is tuned according to an electric signal applied to the active layer and the plurality of metal layers; and
   a plurality of dielectric layers spaced apart from one another and each having one surface contacting a metal layer among the plurality of metal layers and another surface contacting the active layer.

2. The meta-structure of claim 1, further comprising a voltage-applying portion configured to apply a voltage between the active layer and the plurality of dielectric layers to generate the electrical signal.

3. The meta-structure of claim 2, wherein the voltage-applying portion is configured to a same voltage between the active layer and each of the plurality of metal layers.

4. The meta-structure of claim 2, wherein, when a voltage is applied between the active layer and the plurality of metal layers, carrier accumulation layers having a tunable charge density are formed on ends of the active layer that contact the plurality of dielectric layers among regions of the active layer.

5. The meta-structure of claim 2, wherein the active layer comprises a transparent conductive oxide, a nitride, or a doped semiconductor material.

6. The meta-structure of claim 1, wherein the dielectric layer comprises any one among $SiO_2$, $Al_2O_3$, $HfO_2$, $HfSiO_4$, a transition metal oxide, and electrochromic polymer.

7. The meta-structure of claim 1, wherein a dielectric breakdown electric field $E_{br}$ and a direct current (DC) dielectric constant $k_{diel}$ of one of the dielectric layers satisfy the following equation:

$$k_{diel} E_{br} \geq \frac{|e|Nd}{\varepsilon_0},$$

where N is a carrier concentration of the carrier accumulation layers, e is a quantity of electric charge of electrons, $\epsilon_0$ is a permittivity of a vacuum, and d is a Debye length.

8. The meta-structure of claim 1, wherein the metal layer comprises one among Cu, Al, Ni, Fe, Co, Zn, Ti, Ru, Rh, Pd, Pt, Ag, Os, Ir, Au, and TiN.

9. A tunable optical device comprising:
a meta-structure comprising:
  a plurality of metal layers spaced apart from one another;
  an active layer spaced apart from the plurality of metal layers and having a carrier concentration that is tuned according to an electric signal applied to the active layer and the plurality of metal layers; and
  a plurality of dielectric layers spaced apart from one another and each having one surface contacting a metal layer among the plurality of metal layers and another surface contacting the active layer,
a voltage-applying portion configured to apply a voltage between the active layer and the plurality of metal layers to generate the electric signal; and
a controller configured to control the voltage to be applied between the active layer and the plurality of metal layers by the voltage-applying portion according to an optical property to be controlled in the meta-structure.

10. The tunable optical device of claim 9, wherein the controller is configured to control the voltage so that birefringence of the meta-structure is tuned.

11. The tunable optical device of claim 9, wherein the controller is configured to control the voltage so that dichroism of the meta-structure is tuned.

12. The tunable optical device of claim 9, wherein the controller is configured to control the voltage so that an optical band gap of the meta-structure is tuned.

13. The tunable optical device of claim 9, further comprising:
a plurality of meta-structures arranged two-dimensionally; and
a circuit board comprising a circuit element configured to apply a voltage to each of the plurality of meta-structures.

14. The tunable optical device of claim 13, wherein an extraordinary axis of each of the meta-structures is defined as a direction along which the plurality of metal layers, the active layer, and the plurality of dielectric layers are spaced apart, and the extraordinary axis of each of the meta-structures is in parallel to a plane defined by the two-dimensional arrangement.

15. The tunable optical device of claim 13, wherein an extraordinary axis of each of the meta-structures is defined as a direction along which the plurality of metal layers, the active layer, and the plurality of dielectric layers are spaced apart, and the extraordinary axis of each of the meta-structures is perpendicular to a plane defined by the two-dimensional arrangement.

16. A display apparatus comprising:
a first substrate comprising a first polarization plate;
a second substrate comprising a second polarization plate;
an optical modulator provided between the first substrate and the second substrate and comprising a plurality of meta-structures, each of the meta-structures comprising:
  a plurality of metal layers spaced apart from one another;
  an active layer spaced apart from the plurality of metal layers and having a carrier concentration that is tuned according to an electric signal applied to the active layer and the plurality of metal layers; and
  a plurality of dielectric layers spaced apart from one another and each having one surface contacting a metal layer among the plurality of metal layers and another surface contacting the active layer; and
a circuit board comprising a circuit element configured to apply a voltage to each of the plurality of meta-structures to generate the electrical signal.

17. The display apparatus of claim 16, further comprising a backlight unit configured to provide light to be modulated by the optical modulator.

18. An optical memory device comprising:
a meta-structure comprising:
  a plurality of metal layers spaced apart from one another;
  an active layer spaced apart from the plurality of metal layers and having a carrier concentration that is tuned according to an electric signal applied to the active layer and the plurality of metal layers; and
  a plurality of dielectric layers spaced apart from one another and each having one surface contacting a metal layer among the plurality of metal layers and another surface contacting the active layer;
a first quantum emitter and a second quantum emitter, the first and second quantum emitters provided adjacent to the meta-structure and configured to exchange optical energy with each other; and
a controller configured to apply a voltage for controlling an optical band gap of the meta-structure to the meta-structure.

19. The optical memory device of claim 18, wherein the first and second quantum emitters are provided on the meta-structure or embedded in the meta-structure.

20. The optical memory device of claim 18, wherein the controller is configured to apply a first voltage to the meta-structure when the second quantum emitter is excited by optical energy emitted according to a change of a state of the first quantum emitter and to apply a second voltage different from the first voltage to the meta-structure in a state in which the second quantum emitter is preserved.

* * * * *